US00RE46809E

(19) United States
(12) Reissued Patent
Kirisawa et al.

(10) Patent Number: US RE46,809 E
(45) Date of Reissued Patent: *Apr. 24, 2018

(54) NONVOLATILE SEMICONDUCTOR MEMORY DEVICE

(71) Applicant: TOSHIBA MEMORY CORPORATION, Minato-ku (JP)

(72) Inventors: Ryouhei Kirisawa, Yokohama (JP); Masaru Kito, Yokohama (JP); Shigeto Oota, Yokohama (JP); Yoshimasa Mikajiri, Yokohama (JP)

(73) Assignee: TOSHIBA MEMORY CORPORATION, Minato-ku (JP)

( * ) Notice: This patent is subject to a terminal disclaimer.

(21) Appl. No.: 15/018,381

(22) Filed: Feb. 8, 2016

Related U.S. Patent Documents

Reissue of:
(64) Patent No.: 8,320,182
Issued: Nov. 27, 2012
Appl. No.: 12/725,827
Filed: Mar. 17, 2010

U.S. Applications:
(63) Continuation of application No. 14/335,639, filed on Jul. 18, 2014, now Pat. No. Re. 45,972.

(30) Foreign Application Priority Data

Sep. 1, 2009 (JP) ..... 2009-202063

(51) Int. Cl.
*G11C 11/34* (2006.01)
*G11C 16/04* (2006.01)
(Continued)

(52) U.S. Cl.
CPC ..... *G11C 16/14* (2013.01); *G11C 16/0483* (2013.01); *G11C 16/10* (2013.01); *G11C 16/26* (2013.01); *H01L 27/11582* (2013.01)

(58) Field of Classification Search
CPC ..... G11C 16/0483; G11C 16/10; G11C 16/14; G11C 16/26; H01L 27/11582
(Continued)

(56) References Cited

U.S. PATENT DOCUMENTS 7,936,004 B2 * 5/2011 Kito et al. ..... 257/324
8,743,624 B2 * 6/2014 Lutze ..... G11C 11/5635 365/185.24
(Continued)

FOREIGN PATENT DOCUMENTS

JP 10-302488 11/1998
JP 2000-222895 8/2000
(Continued)

OTHER PUBLICATIONS

Notification of Reason(s) for Refusal dated Feb. 2, 2012 in Japanese patent Application No. 2009-202063 (with English translation).

*Primary Examiner* — Ovidio Escalante
(74) *Attorney, Agent, or Firm* — Oblon, McClelland, Maier & Neustadt, L.L.P.

(57) ABSTRACT

A nonvolatile semiconductor memory device includes: a memory unit; and a control unit. The memory unit includes: first and second memory strings including first and second memory transistors with first and second select gates, respectively; and first and second wirings connected thereto. In a selective erase operation of a selected cell transistor of the first memory transistors, the control unit applies V1 voltage to the first wiring, applies V2 voltage lower than V1 to a selected cell gate of the selected cell transistor, applies V3 voltage not higher than V1 and higher than V2 to a non-selected cell gate of the first memory transistors, applies V1 or V4 voltage not higher than V1 and not lower than V3 to the first select gate, and applies V2 or V4 voltage higher than V2 and not higher than V3 to the second wiring or sets the second wiring in a floating state.

20 Claims, 15 Drawing Sheets

(51) Int. Cl.

| | |
|---|---|
| ***G11C 16/14*** | (2006.01) |
| ***G11C 16/10*** | (2006.01) |
| ***H01L 27/11582*** | (2017.01) |
| ***G11C 16/26*** | (2006.01) |

(58) Field of Classification Search
USPC ..... 365/185.17, 185.29; 257/324, E21.693
See application file for complete search history.

(56) References Cited

U.S. PATENT DOCUMENTS

| | | | | |
|---|---|---|---|---|
| 2005/0094431 | A1* | 5/2005 | Sato | G11C 16/06 365/154 |
| 2007/0252201 | A1 | 11/2007 | Kito et al. | |
| 2008/0067583 | A1* | 3/2008 | Kidoh | H01L 21/8221 257/326 |
| 2008/0247240 | A1* | 10/2008 | Lee | G11C 16/0483 365/185.22 |
| 2009/0310425 | A1* | 12/2009 | Sim et al. | 365/185.29 |
| 2010/0207195 | A1 | 8/2010 | Fukuzumi et al. | |
| 2010/0301405 | A1 | 12/2010 | Oota et al. | |
| 2011/0103153 | A1* | 5/2011 | Katsumata et al. | 365/185.23 |
| 2011/0216603 | A1* | 9/2011 | Han et al. | 365/185.23 |
| 2011/0310670 | A1* | 12/2011 | Shim et al. | 365/185.17 |

FOREIGN PATENT DOCUMENTS

| | | |
|---|---|---|
| JP | 2006-190820 | 7/2006 |
| JP | 2009-146954 | 7/2009 |
| WO | WO 2007/109883 | 10/2007 |
| WO | WO 2007/109883 A1 | 10/2007 |

* cited by examiner

| | BL | | SL | | SG | | | | CG1A | | | | CG2A | | | |
|---|---|---|---|---|---|---|---|---|---|---|---|---|---|---|---|---|
| | BL1 W11 | BL2 W21 | SL1 W12 | SL2 W22 | SGD1 SG11 | SGD2 SG21 | SGS1 SG12 | SGS2 SG22 | CG1-1 | CG1-2 | CG1-3 (CL1) | CG1-4 | CG2-1 | CG2-2 | CG2-3 | CG2-4 |
| ER | Vpp (V1) | Vcc (V5) / 0V / OPN | Vpp (V1) / Vcc / 0V / OPN | Vcc (V5) / 0V / OPN | Vm (V4) / Vpp (V1) | 0V (V7) | Vm (V4) / Vpp (V1) | 0V (V7) | Vm (V3) | Vm (V3) | 0V (V2) | Vm (V3) | 0V (V6) / Vm (V3) | 0V (V6) / Vm (V3) | 0V (V6) / Vm (V3) | 0V (V6) / Vm (V3) |
| WR | 0V | Vcc | Vcc / 0V / OPN | Vcc / 0V / OPN | Vcc | 0V | 0V | 0V | Vcc | Vcc | Vpp | Vcc | 0V | 0V | 0V | 0V |
| RD | Ve | 0V | 0V | 0V | Vcc | 0V | Vcc | 0V | Vcc | Vcc | Vse | Vcc | 0V | 0V | 0V | 0V |

| | | CL1 | | | CL2 | | | CL3 | | | CL4 | | |
|---|---|---|---|---|---|---|---|---|---|---|---|---|---|
| | | ER | WR | RD | ER | WR | RD | ER | WR | RD | ER | WR | RD |
| BL | BL1 (W11) | Vpp (V1) | 0V | Ve | Vcc/0V /OPN | Vcc | 0V | Vpp | 0V | Ve | Vcc/0V /OPN | Vcc | 0V |
| | BL2 (W21) | Vcc(V5)/0V /OPN | Vcc | 0V | Vpp | 0V | Ve | Vcc/0V /OPN | Vcc | 0V | Vpp | 0V | Ve |
| SL | SL1 (W12) | Vpp(V1)/Vcc (V5)/0V/OPN | Vcc/0V /OPN | 0V | Vpp/Vcc /0V/OPN | Vcc/0V /OPN | 0V | Vcc/0V /OPN | 0V | 0V | Vcc/0V /OPN | 0V | 0V |
| | SL2 (W22) | Vcc(V5)/0V /OPN | 0V | 0V | Vcc/0V /OPN | 0V | 0V | Vpp/Vcc /0V/OPN | Vcc/0V /OPN | 0V | Vpp/Vcc /0V/OPN | Vcc/0V /OPN | 0V |
| SG | SGD1 (SG11) | Vm(V4)/Vpp(V1) | Vcc | Vcc | Vm/Vpp | Vcc | Vcc | 0V | 0V | 0V | 0V | 0V | 0V |
| | SGD2 (SG21) | 0V (V8) | 0V | 0V | 0V | 0V | 0V | Vm/Vpp | Vcc | Vcc | Vm/Vpp | Vcc | Vcc |
| | SGS1 (SG12) | 0V (V8) | 0V | Vcc | 0V | 0V | Vcc | 0V | 0V | 0V | 0V | 0V | 0V |
| | SGS2 (SG22) | 0V (V8) | 0V | 0V | 0V | 0V | 0V | 0V | 0V | Vcc | 0V | 0V | Vcc |
| CG1A | CG0/1-1 | Vm (V3) | Vcc | Vcc | Vm | Vcc | Vcc | 0V/Vm | 0V | 0V | 0V/Vm | 0V | 0V |
| | CG0/1-2 | Vm (V3) | Vcc | Vcc | Vm | Vcc | Vcc | 0V/Vm | 0V | 0V | 0V/Vm | 0V | 0V |
| | CG0/1-3 | 0V (V2) | Vpp | Vse | Vm | Vcc | Vcc | 0V/Vm | 0V | 0V | 0V/Vm | 0V | 0V |
| | CG0/1-4 | Vm (V3) | Vcc | Vcc | Vm | Vcc | Vcc | 0V/Vm | 0V | 0V | 0V/Vm | 0V | 0V |
| CG1B | CG1/2-5 | Vm (V3) | Vcc | Vcc | Vm | Vcc | Vcc | Vm | Vcc | Vcc | Vm | Vcc | Vcc |
| | CG1/2-6 | Vm (V3) | Vcc | Vcc | 0V | Vpp | Vse | 0V | Vpp | Vse | Vm | Vcc | Vcc |
| | CG1/2-7 | Vm (V3) | Vcc | Vcc | Vm | Vcc | Vcc | Vm | Vcc | Vcc | Vm | Vcc | Vcc |
| | CG1/2-8 | Vm (V3) | Vcc | Vcc | Vm | Vcc | Vcc | Vm | Vcc | Vcc | Vm | Vcc | Vcc |
| CG2A | CG2/3-1 | 0V(V6)/Vm(V3) | 0V/Vcc | 0V | 0V/Vm | 0V | 0V | Vm | Vcc | Vcc | Vm | Vcc | Vcc |
| | CG2/3-2 | 0V(V6)/Vm(V3) | 0V/Vcc | 0V | 0V/Vm | 0V | 0V | Vm | Vcc | Vcc | Vm | Vcc | Vcc |
| | CG2/3-3 | 0V(V6)/Vm(V3) | 0V/Vcc | 0V | 0V/Vm | 0V | 0V | Vm | Vcc | Vcc | 0V | Vpp | Vse |
| | CG2/3-4 | 0V(V6)/Vm(V3) | 0V/Vcc | 0V | 0V/Vm | 0V | 0V | Vm | Vcc | Vcc | Vm | Vcc | Vcc |
| BG | BG1 (CPG1) | Vm (V9) | Vcc | Vcc | 0V | 0V | 0V | Vm | Vcc | Vcc | 0V | 0V | 0V |
| | BG2 (CPG2) | 0V (V2) | 0V | 0V | Vm | Vcc | Vcc | 0V | 0V | 0V | Vm | Vcc | Vcc |

FIG. 6

FIG. 8

| | | CL1 | | | CL2 | | | CL3 | | | CL4 | | |
|---|---|---|---|---|---|---|---|---|---|---|---|---|---|
| | | ER | WR | RD | ER | WR | RD | ER | WR | RD | ER | WR | RD |
| BL | BL1 | Vpp | 0V | Ve | Vcc/0V/OPN | Vcc | 0V | Vpp | 0V | Ve | Vcc/0V/OPN | Vcc | 0V |
| | BL2 | Vcc/0V/OPN | Vcc | 0V | Vpp | 0V | Ve | Vcc/0V/OPN | Vcc | 0V | Vpp | 0V | Ve |
| SL | SL1 | Vpp/Vcc/0V/OPN | Vcc/0V/OPN | 0V | Vpp/Vcc/0V/OPN | Vcc/0V/OPN | 0V | Vcc/0V/OPN | 0V | 0V | Vcc/0V/OPN | 0V | 0V |
| | SL2 | Vcc/0V/OPN | 0V | 0V | Vcc/0V/OPN | 0V | 0V | Vpp/Vcc/0V/OPN | Vcc/0V/OPN | 0V | Vpp/Vcc/0V/OPN | Vcc/0V/OPN | 0V |
| SG | SGD1 | Vm/Vpp | Vcc | Vcc | Vm/Vpp | Vcc | Vcc | 0V | 0V | 0V | 0V | 0V | 0V |
| | SGD2 | 0V | 0V | 0V | 0V | 0V | 0V | Vm/Vpp | Vcc | Vcc | Vm/Vpp | Vcc | Vcc |
| | SGS1 | 0V | 0V | Vcc | 0V | 0V | Vcc | 0V | 0V | 0V | 0V | 0V | 0V |
| | SGS2 | 0V | 0V | 0V | 0V | 0V | 0V | 0V | 0V | Vcc | 0V | 0V | Vcc |
| CG1A | CG1-1 | Vm | Vcc | Vcc | Vm | Vcc | Vcc | 0V | 0V | 0V | 0V | 0V | 0V |
| | CG1-2 | Vm | Vcc | Vcc | Vm | Vcc | Vcc | 0V | 0V | 0V | 0V | 0V | 0V |
| | CG1-3 | 0V | Vpp | Vse | Vm | Vcc | Vcc | 0V | 0V | 0V | 0V | 0V | 0V |
| | CG1-4 | Vm | Vcc | Vcc | Vm | Vcc | Vcc | 0V | 0V | 0V | 0V | 0V | 0V |
| CG1B | CG1-5 | Vm | Vcc | Vcc | Vm | Vcc | Vcc | 0V | 0V | 0V | 0V | 0V | 0V |
| | CG1-6 | Vm | Vcc | Vcc | 0V | Vpp | Vse | 0V | 0V | 0V | 0V | 0V | 0V |
| | CG1-7 | Vm | Vcc | Vcc | Vm | Vcc | Vcc | 0V | 0V | 0V | 0V | 0V | 0V |
| | CG1-8 | Vm | Vcc | Vcc | Vm | Vcc | Vcc | 0V | 0V | 0V | 0V | 0V | 0V |
| CG2A | CG2-1 | 0V | 0V | 0V | 0V | 0V | 0V | Vm | Vcc | Vcc | Vm | Vcc | Vcc |
| | CG2-2 | 0V | 0V | 0V | 0V | 0V | 0V | Vm | Vcc | Vcc | Vm | Vcc | Vcc |
| | CG2-3 | 0V | 0V | 0V | 0V | 0V | 0V | Vm | Vcc | Vcc | 0V | Vpp | Vse |
| | CG2-4 | 0V | 0V | 0V | 0V | 0V | 0V | Vm | Vcc | Vcc | Vm | Vcc | Vcc |
| CG2B | CG2-5 | 0V | 0V | 0V | 0V | 0V | 0V | Vm | Vcc | Vcc | Vm | Vcc | Vcc |
| | CG2-6 | 0V | 0V | 0V | 0V | 0V | 0V | 0V | Vpp | Vse | Vm | Vcc | Vcc |
| | CG2-7 | 0V | 0V | 0V | 0V | 0V | 0V | Vm | Vcc | Vcc | Vm | Vcc | Vcc |
| | CG2-8 | 0V | 0V | 0V | 0V | 0V | 0V | Vm | Vcc | Vcc | Vm | Vcc | Vcc |
| BG | BG1 | Vm | Vcc | Vcc | 0V | 0V | 0V | Vm | Vcc | Vcc | 0V | 0V | 0V |
| | BG2 | 0V | 0V | 0V | Vm | Vcc | Vcc | 0V | 0V | 0V | Vm | Vcc | Vcc |

FIG. 12

| | | CL1 | | | CL2 | | | CL3 | | | CL4 | | |
|---|---|---|---|---|---|---|---|---|---|---|---|---|---|
| | | ER | WR | RD | ER | WR | RD | ER | WR | RD | ER | WR | RD |
| BL | BL1 (W11) | Vpp (V1) /OPN | 0V | Ve | Vm/OPN | Vcc/OPN | 0V | Vpp/OPN | 0V | Ve | Vm/OPN | Vcc/OPN | 0V |
| | BL2 (W21) | Vm (V12) /OPN | Vcc/OPN | 0V | Vpp/OPN | 0V | Ve | Vm/OPN | Vcc/OPN | 0V | Vpp/OPN | 0V | Ve |
| SL | SL1 (W12) | Vpp (V1) /OPN | Vcc/0V/ OPN | 0V | Vm/OPN | Vcc/0V/ OPN | 0V | Vpp/OPN | Vcc/0V/ OPN | 0V | Vpp/OPN | Vcc/0V/ OPN | 0V |
| | SL2 (W22) | Vm (V12) /OPN | Vcc/0V/ OPN | 0V | Vpp/OPN | Vcc/0V/ OPN | 0V | Vm/OPN | Vcc/0V/ OPN | 0V | Vm/OPN | Vcc/0V/ OPN | 0V |
| SG | SGD1 (SG11) | Vm (V10) | Vcc | Vcc | Vm | Vcc | Vcc | Vm | Vcc/0V/ OPN | 0V | Vm | Vcc/0V/ OPN | 0V |
| | SGD2 (SG21) | Vm (V10) | Vcc/0V/ OPN | 0V | Vm | Vcc/0V/ OPN | 0V | Vm | Vcc | Vcc | Vm | Vcc | Vcc |
| | SGS1 (SG12) | Vm (V10) | 0V | Vcc | Vm | 0V | Vcc | Vm | Vcc/0V/ OPN | 0V | Vm | Vcc/0V/ OPN | 0V |
| | SGS2 (SG22) | Vm (V10) | Vcc/0V/ OPN | 0V | Vm | Vcc/0V/ OPN | 0V | Vm | 0V | Vcc | Vm | 0V | Vcc |
| CG1A | CG1-1 | Vm (V3) | Vcc | Vcc | Vm | Vcc | Vcc | Vm | Vcc/0V | 0V | Vm | Vcc/0V | 0V |
| | CG1-2 | Vm (V3) | Vcc | Vcc | Vm | Vcc | Vcc | Vm | Vcc/0V | 0V | Vm | Vcc/0V | 0V |
| | CG1-3 | 0V (V2) | Vpp | Vse | Vm | Vcc | Vcc | Vm | Vcc/0V | 0V | Vm | Vcc/0V | 0V |
| | CG1-4 | Vm (V3) | Vcc | Vcc | Vm | Vcc | Vcc | Vm | Vcc/0V | 0V | Vm | Vcc/0V | 0V |
| CG1B | CG1-5 | Vm (V3) | Vcc | Vcc | Vm | Vcc | Vcc | Vm | Vcc/0V | 0V | Vm | Vcc/0V | 0V |
| | CG1-6 | Vm (V3) | Vcc | Vcc | 0V | Vpp | Vse | Vm | Vcc/0V | 0V | Vm | Vcc/0V | 0V |
| | CG1-7 | Vm (V3) | Vcc | Vcc | Vm | Vcc | Vcc | Vm | Vcc/0V | 0V | Vm | Vcc/0V | 0V |
| | CG1-8 | Vm (V3) | Vcc | Vcc | Vm | Vcc | Vcc | Vm | Vcc/0V | 0V | Vm | Vcc/0V | 0V |
| CG2A | CG2-1 | Vm (V3) | Vcc/0V | 0V | Vm | Vcc/0V | 0V | Vm | Vcc | Vcc | Vm | Vcc | Vcc |
| | CG2-2 | Vm (V3) | Vcc/0V | 0V | Vm | Vcc/0V | 0V | Vm | Vcc | Vcc | Vm | Vcc | Vcc |
| | CG2-3 | Vm (V3) | Vcc/0V | 0V | Vm | Vcc/0V | 0V | Vm | Vcc | Vcc | 0V | Vpp | Vse |
| | CG2-4 | Vm (V3) | Vcc/0V | 0V | Vm | Vcc/0V | 0V | Vm | Vcc | Vcc | Vm | Vcc | Vcc |
| CG2B | CG2-5 | Vm (V3) | Vcc/0V | 0V | Vm | Vcc/0V | 0V | Vm | Vcc | Vcc | Vm | Vcc | Vcc |
| | CG2-6 | Vm (V3) | Vcc/0V | 0V | Vm | Vcc/0V | 0V | 0V | Vpp | Vse | Vm | Vcc | Vcc |
| | CG2-7 | Vm (V3) | Vcc/0V | 0V | Vm | Vcc/0V | 0V | Vm | Vcc | Vcc | Vm | Vcc | Vcc |
| | CG2-8 | Vm (V3) | Vcc/0V | 0V | Vm | Vcc/0V | 0V | Vm | Vcc | Vcc | Vm | Vcc | Vcc |
| BG | BG1 (CPG1) | Vm (V11) | Vcc | Vcc | Vm | Vcc | Vcc | Vm | Vcc/0V | 0V | Vm | Vcc/0V | 0V |
| | BG2 (CPG2) | Vm (V11) | Vcc/0V/ OPN | 0V | Vm | Vcc/0V | 0V | Vm | Vcc | Vcc | Vm | Vcc | Vcc |
| SB | SB1 | Vpp (V1) | 0V | 0V | Vm/OPN | Vcc/OPN | 0V | Vpp | 0V | 0V | Vm/OPN | Vcc/OPN | 0V |
| | SB2 | Vm (V13) /OPN | Vcc/0V/ OPN | 0V | Vpp | 0V | 0V | Vm/OPN | Vcc/OPN | 0V | Vpp | 0V | 0V |

FIG. 14

| | | CL1 | | | CL2 | | | CL3 | | | CL4 | | |
|---|---|---|---|---|---|---|---|---|---|---|---|---|---|
| | | ER | WR | RD | ER | WR | RD | ER | WR | RD | ER | WR | RD |
| BL | BL1 | Vpp/OPN | 0V | Ve | Vm/OPN | Vcc/OPN | 0V | Vpp/OPN | 0V | Ve | Vm/Open | Vcc/OPN | 0V |
| | BL2 | Vm/OPN | Vcc/OPN | 0V | Vpp/OPN | 0V | Ve | Vm/OPN | Vcc/OPN | 0V | Vpp/Open | 0V | Ve |
| SL | SL1 | Vpp/OPN | Vcc/0V/OPN | 0V | Vm/OPN | Vcc/0V/OPN | 0V | Vpp/OPN | Vcc/0V/OPN | 0V | Vm/OPN | Vcc/0V/OPN | 0V |
| | SL2 | Vm/OPN | Vcc/0V/OPN | 0V | Vpp/OPN | Vcc/0V/OPN | 0V | Vm/OPN | Vcc/0V/OPN | 0V | Vpp/OPN | Vcc/0V/OPN | 0V |
| SG | SGD1 | Vm | Vcc | Vcc | Vm | Vcc | Vcc | Vm | Vcc/0V/OPN | 0V | Vm | Vcc/0V/OPN | 0V |
| | SGD2 | Vm | Vcc/0V/OPN | 0V | Vm | Vcc/0V/OPN | 0V | Vm | Vcc | Vcc | Vm | Vcc | Vcc |
| | SGS1 | Vm | 0V | Vcc | Vm | 0V | Vcc | Vm | Vcc/0V/OPN | 0V | Vm | Vcc/0V/OPN | 0V |
| | SGS2 | Vm | Vcc/0V/OPN | 0V | Vm | Vcc/0V/OPN | 0V | Vm | 0V | Vcc | Vm | 0V | Vcc |
| CG1A | CG0/1-1 | Vm | Vcc | Vcc | Vm | Vcc | Vcc | Vm | Vcc/0V | 0V | Vm | Vcc/0V | 0V |
| | CG0/1-2 | Vm | Vcc | Vcc | Vm | Vcc | Vcc | Vm | Vcc/0V | 0V | Vm | Vcc/0V | 0V |
| | CG0/1-3 | 0V | Vpp | Vse | Vm | Vcc | Vcc | Vm | Vcc/0V | 0V | Vm | Vcc/0V | 0V |
| | CG0/1-4 | Vm | Vcc | Vcc | Vm | Vcc | Vcc | Vm | Vcc/0V | 0V | Vm | Vcc/0V | 0V |
| CG1B | CG1/2-5 | Vm | Vcc | Vcc | Vm | Vcc | Vcc | Vm | Vcc | 0V | Vm | Vcc/0V | 0V |
| | CG1/2-6 | Vm | Vcc | Vcc | 0V | Vpp | Vse | 0V | Vpp | Vse | Vm | Vcc/0V | 0V |
| | CG1/2-7 | Vm | Vcc | Vcc | Vm | Vcc | Vcc | Vm | Vcc | 0V | Vm | Vcc/0V | 0V |
| | CG1/2-8 | Vm | Vcc | Vcc | Vm | Vcc | Vcc | Vm | Vcc | 0V | Vm | Vcc/0V | 0V |
| CG2A | CG2/3-1 | Vm | Vcc/0V | 0V | Vm | Vcc/0V | 0V | Vm | Vcc | Vcc | Vm | Vcc | Vcc |
| | CG2/3-2 | Vm | Vcc/0V | 0V | Vm | Vcc/0V | 0V | Vm | Vcc | Vcc | Vm | Vcc | Vcc |
| | CG2/3-3 | Vm | Vcc/0V | 0V | Vm | Vcc/0V | 0V | Vm | Vcc | Vcc | 0V | Vpp | Vse |
| | CG2/3-4 | Vm | Vcc/0V | 0V | Vm | Vcc/0V | 0V | Vm | Vcc | Vcc | Vm | Vcc | Vcc |
| BG | BG1 | Vm | Vcc | Vcc | Vm | Vcc | Vcc | Vm | Vcc/0V/OPN | 0V | Vm | Vcc/0V/OPN | 0V |
| | BG2 | Vm | Vcc/0V/OPN | 0V | Vm | Vcc/0V/OPN | 0V | Vm | Vcc | Vcc | Vm | Vcc | Vcc |
| SB | SB1 | Vpp | 0V | 0V | Vm/OPN | Vcc/0V/OPN | 0V | Vpp | 0V | 0V | Vm/OPN | Vcc/0V/OPN | 0V |
| | SB2 | Vm/OPN | Vcc/0V/OPN | 0V | Vpp | 0V | 0V | Vm/OPN | Vcc/0V/OPN | 0V | Vpp | 0V | 0V |

NONVOLATILE SEMICONDUCTOR MEMORY DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*More than one reissue application has been filed for the reissue of U.S. Pat. No. 8,320,182. The reissue applications are the present reissue continuation application and Ser. No. 14/335,639 (parent application). The present application claims benefit of priority under 35 U.S.C. § 120 of application Ser. No. 14/335,639.*

CROSS-REFERENCE TO RELATED APPLICATIONS

This application is based upon and claims the benefit of priority from the prior Japanese Patent Application No. 2009-202063, filed on Sep. 1, 2009; the entire contents of which are incorporated herein by reference.

BACKGROUND

1. Field

Embodiments of the invention relate generally to a nonvolatile semiconductor memory device.

2. Background Art

Conventional flash memories are based on collective erase and selective write operation. In this operation, memory cells in no need of rewriting data are also rewritten. Hence, the reliability may be degraded with the increasing number of times of rewriting data. Further, a rewriting speed is decreased because memory cells in no need of rewriting data to rewrite are rewritten.

In conventional memories, a plurality of memory cells are formed in a common semiconductor layer on a substrate and have a common channel, which makes it difficult to implement selective erasure. In this context, JP-A 2006-190820 (Kokai) discloses a method for selective erasure by using holes resulting from band-to-band tunneling current. However, this method is prone to degradation in reliability because a local electric field is applied to memory cells. Furthermore, the operation is unstable because of the narrow driving margin between the selected cell and the non-selected cell.

It is desired to realize a memory in which only the memory cell in need of rewriting data can be selectively and stably rewritten so that the lifetime of memory cells can be extended. Further, it is possible to rewrite data at high speed by selective erasure.

SUMMARY

According to an aspect of the invention, there is provided a nonvolatile semiconductor memory device including: a memory unit; and a control unit, the memory unit including a first memory string, a first wiring, a second memory string, and a second wiring, the first memory string including a first memory cell group and a first select transistor, the first memory cell group including a plurality of first memory transistors connected in series, each of the plurality of first memory transistors including a channel formed in a first semiconductor layer, including a first control gate, and allowing data of the each of the plurality of first memory transistors to be electrically rewritten, the first select transistor being provided on one end side of the first memory cell group, including a channel formed in the first semiconductor layer, and including a first select gate, the first wiring being connected to the first semiconductor layer on a side of the first select transistor opposite to the first memory cell group, the second memory string including a second memory cell group and a second select transistor, the second memory cell group including a plurality of second memory transistors connected in series, each of the plurality of second memory transistors including a channel formed in a second semiconductor layer electrically isolated from the first semiconductor layer, including a control gate electrically connected to the first control gate, and allowing data of the each of the plurality of second memory transistors to be electrically rewritten, the second select transistor being provided on one end side of the second memory cell group, including a channel formed in the second semiconductor layer, and including a select gate connected to the first select gate, the second wiring being connected to the second semiconductor layer on a side of the second select transistor opposite to the second memory cell group, in a selective erase operation for performing at least one of injection of a hole into a charge retention layer of a selected cell transistor in the selective erase operation of the first memory transistors and extraction of an electron from the charge retention layer of the selected cell transistor in the selective erase operation, the control unit being configured to: apply a first voltage to the first wiring, apply a second voltage lower than the first voltage to a selected cell gate of the first control gate of the selected cell transistor in the selective erase operation, apply a third voltage not higher than the first voltage and higher than the second voltage to a non-selected cell gate in the selective erase operation of the first control gate of the first memory transistors other than the selected cell transistor in the selective erase operation, apply the first voltage or a fourth voltage not higher than the first voltage and not lower than the third voltage to the first select gate, and apply the second voltage or a fifth voltage higher than the second voltage and not higher than the third voltage to the second wiring or set the second wiring in a floating state.

According to another aspect of the invention, there is provided a nonvolatile semiconductor memory device including: a memory unit; and a control unit, the memory unit including a first memory string, a first wiring, a first other wiring, and a first base wiring, the first memory string including a first memory cell group, a first other memory cell group, a first select transistor, a first other select transistor, and a first connecting portion transistor, the first memory cell group including a plurality of first memory transistors connected in series, each of the plurality of first memory transistors including a channel formed in a first semiconductor layer provided in contact with a first base semiconductor layer, including a first control gate, and allowing data of the each of the plurality of first memory transistors to be electrically rewritten, the first select transistor being provided on one end side of the first memory cell group, including a channel formed in the first semiconductor layer, and including a first select gate, the first other select transistor being provided on a side of the first memory cell group opposite to the first select transistor, including a channel formed in the first semiconductor layer, and including a first other select gate, the first connecting portion transistor being provided between the first memory cell group and the first other select transistor, including a channel formed in the first semiconductor layer, and including a first connecting portion gate, the first other memory cell group being provided between the first other select transistor and the first connecting portion transistor and including a plurality of first other memory transistors connected in series, each of the plurality of first other memory transistors including a channel formed in the first semiconductor layer, including a first other control gate, and allowing data of the each of the plurality of first other memory transistors to be electrically rewritten, the first wiring being connected to the first semiconductor layer on a side of the first select transistor opposite to the first memory cell group, the first other wiring being connected to the first semiconductor layer on a side of the first other select transistor opposite to the first other memory cell group, the first base wiring being connected to the first base semiconductor layer, in a selective erase operation for performing at least one of injection of a hole into a charge retention layer of a selected cell transistor in the selective erase operation of the first memory transistors and extraction of an electron from the charge retention layer of the selected cell transistor in the selective erase operation, the control unit being configured to: apply a first voltage to the first wiring and the first other wiring or set the first wiring and the first other wiring in a floating state, apply a second voltage lower than the first voltage to a selected cell gate of the first control gate of the selected cell transistor in the selective erase operation, apply a third voltage lower than the first voltage and higher than the second voltage to a non-selected cell gate in the selective erase operation of the first control gate of the first memory transistors other than the selected cell transistor in the selective erase operation, apply the third voltage to the first other control gate, apply a tenth voltage lower than the first voltage and higher than the second voltage to the first select gate and the first other select gate, apply an eleventh voltage lower than the first voltage and higher than the second voltage to the first connecting portion gate, and apply the first voltage to the first base wiring.

BRIEF DESCRIPTION OF THE DRAWINGS

FIG. 6 is a table illustrating the operation of the nonvolatile semiconductor memory device according to the second embodiment;

FIG. 8 is a table illustrating the operation of the alternative nonvolatile semiconductor memory device according to the second embodiment;

FIG. 12 is a table illustrating the operation of the nonvolatile semiconductor memory device according to the third embodiment;

FIG. 14 is a table illustrating the operation of the alternative nonvolatile semiconductor memory device according to the third embodiment.

DETAILED DESCRIPTION

Figures 1A, 1B:
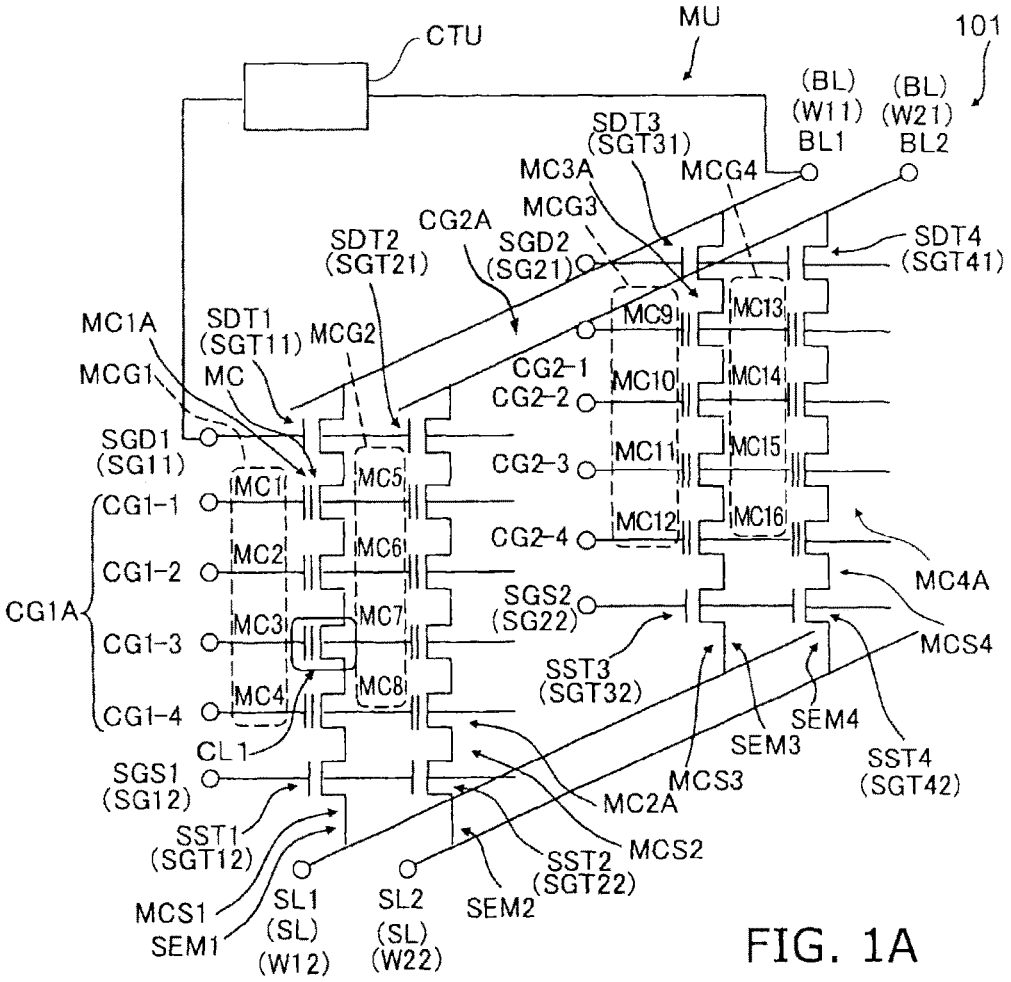
FIGS. 1A and 1B are schematic diagrams illustrating the configuration and operation of a nonvolatile semiconductor memory device according to a first embodiment.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the specification and drawings of the application, the same elements as those described previously with reference to earlier figures are labeled with like reference numerals, and the detailed description thereof is omitted as appropriate.

First Embodiment

FIGS. 1A and 1B are schematic diagrams illustrating the configuration and operation of a nonvolatile semiconductor memory device according to a first embodiment.

More specifically, FIG. 1A is a circuit diagram illustrating the configuration of a nonvolatile semiconductor memory device 101, and FIG. 1B is a table illustrating the operation of the nonvolatile semiconductor memory device 101. In FIG. 1A, for clarity of illustration, some wirings are not shown.

As shown in FIG. 1A, the nonvolatile semiconductor memory device 101 according to this embodiment includes a memory unit MU and a control unit CTU.

The memory unit MU includes a first memory string MCS1, a first wiring W11, a second memory string MCS2, and a second wiring W21.

In the following description, illustratively, a first bit line BL1 is used as the first wiring W11, and a second bit line BL2 is used as the second wiring W21.

The first memory string MCS1 includes a first memory cell group MCG1 and a first select transistor SGT11. In the following description, a first drain side select transistor SDT1 is illustratively used as the first select transistor SGT11.

The first memory cell group MCG1 includes a plurality of first memory transistors MC1A (which are memory cells MC, such as first to fourth memory cells MC1 to MC4) connected in series. Each of the plurality of first memory transistors MC1A allows its data to be electrically rewritten.

Each of the plurality of first memory transistors MC1A includes a first semiconductor layer SEM1. That is, the plurality of first memory transistors MC1A include a channel formed in the first semiconductor layer SEM1. Specifically, a source region, a drain region, and a channel region (channel) of each of the plurality of first memory transistors MC1A are provided in the first semiconductor layer SEM1. Each of the plurality of first memory transistors MC1A (first to fourth memory cells MC1 to MC4) includes a first control gate CG1A (control gates CG1-1 to CG1-4).

The first drain side select transistor SDT1 is provided on one end side of the first memory cell group MCG1. The first drain side select transistor SDT1 includes the same first semiconductor layer SEM1 as the first memory cell group MCG1. That is, the first drain side select transistor SDT1 includes a channel formed in the first semiconductor layer SEM1. Specifically, a source region, a drain region, and a channel region (channel) of the first drain side select transistor SDT1 are provided in the first semiconductor layer SEM1. The first drain side select transistor SDT1 includes a first select gate SG11. In the following description, a first drain side select gate SGD1 is illustratively used as the first select gate SG11.

The first bit line BL1 is connected to the first semiconductor layer SEM1 on the opposite side of the first drain side select transistor SDT1 from the first memory cell group MCG1. The first bit line BL1 functions as a bit line BL in the first memory string MCS1.

In the nonvolatile semiconductor memory device 101 of this example, the first memory string MCS1 further includes a first other select transistor SGT12. In the following description, a first source side select transistor SST1 is illustratively used as the first other select transistor SGT12.

The first source side select transistor SST1 is provided on the opposite side of the first memory cell group MCG1 from the first drain side select transistor SDT1 and includes the first semiconductor layer SEM1. The first source side select transistor SST1 includes a first other select gate SG12. In the following description, a first source side select gate SGS1 is illustratively used as the first other select gate SG12.

The memory unit MU further includes a first other wiring W12. In the following description, a first source line SL1 is illustratively used as the first other wiring W12.

The first source line SL1 is connected to the first semiconductor layer SEM1 on the opposite side of the first source side select transistor SST1 from the first memory cell group MCG1. The first source line SL1 functions as a source line SL in the first memory string MCS1.

On the other hand, the second memory string MCS2 includes a second memory cell group MCG2 and a second select transistor SGT21. In the following description, a second drain side select transistor SDT2 is illustratively used as the second select transistor SGT21.

The second memory cell group MCG2 includes a plurality of second memory transistors MC2A (which are memory cells MC, such as fifth to eighth memory cells MC5 to MC8) connected in series. Each of the plurality of second memory transistors MC2A allows its data to be electrically rewritten.

The plurality of second memory transistors MC2A include a second semiconductor layer SEM2 electrically isolated from the first semiconductor layer SEM1. That is, the plurality of second memory transistors MC2A include a channel formed in the second semiconductor layer SEM2. Specifically, a source region, a drain region, and a channel region (channel) of each of the plurality of second memory transistors MC2A are provided in the second semiconductor layer SEM2 separate from the first semiconductor layer SEM1. The respective control gates of the fifth to eighth memory cells MC5 to MC8 are commonly connected to the control gates (first control gates CG1A, or control gates CG1-1 to CG1-4) of the first to fourth memory cells MC1 to MC4.

The second drain side select transistor SDT2 is provided on one end side of the second memory cell group MCG2. The second drain side select transistor SDT2 includes the same second semiconductor layer SEM2 as the second memory cell group MCG2. That is, the second drain side select transistor SDT2 includes a channel formed in the second semiconductor layer SEM2. Specifically, the source region, the drain region, and the channel region (channel) of the second drain side select transistor SDT2 are provided in the second semiconductor layer SEM2. The second drain side select transistor SDT2 includes a select gate connected to the first drain side select gate SGD1.

The second bit line BL2 is connected to the second semiconductor layer SEM2 on the opposite side of the second drain side select transistor SDT2 from the second memory cell group MCG2. The second bit line BL2 functions as a bit line BL in the second memory string MCS2.

In the nonvolatile semiconductor memory device 101 of this example, the second memory string MCS2 further includes a second other select transistor SGT22. In the following description, a second source side select transistor SST2 is illustratively used as the second other select transistor SGT22.

The second source side select transistor SST2 is provided on the opposite side of the second memory cell group MCG2 from the second drain side select transistor SDT2 and includes the second semiconductor layer SEM2. The second source side select transistor SST2 includes a select gate connected to the first source side select gate SGS1.

The memory unit MU further includes a second other wiring W22. In the following description, a second source line SL2 is illustratively used as the second other wiring W22.

The second source line SL2 is connected to the second semiconductor layer SEM2 on the opposite side of the second source side select transistor SST2 from the second memory cell group MCG2. The second source line SL2 functions as a source line SL in the second memory string MCS2.

In the foregoing, the number of first and second memory transistors MC1A and MC2A is four for each. However, the number of first and second memory transistors MC1A and MC2A is arbitrary as long as it is more than one for each.

The geometry of the first semiconductor layer SEM1 and the second semiconductor layer SEM2 is arbitrary as long as they are electrically isolated from each other. For instance, the first and second semiconductor layers SEM1 and SEM2 are provided on a substrate (e.g., silicon substrate) so as to align in the direction perpendicular to the major surface of the substrate. Alternatively, the first and second semiconductor layers SEM1 and SEM2 may be an SOI (silicon on insulator) provided on a substrate. In this case, the first and second semiconductor layers SEM1 and SEM2 align in a plane parallel to the major surface of the substrate.

The number of semiconductor layers is arbitrary as long as the first to n-th semiconductor layers are electrically isolated from each other, where n is any integer of two or more. The geometry (e.g., positional relation to the major surface of the substrate) of the first to n-th semiconductor layer is arbitrary.

Furthermore, whether perpendicular or parallel to the major surface of the substrate, the first to n-th semiconductor layers are not limited to linearly aligning in one direction but may be folded back in a "U-shape" or "W-shape", for instance.

In the following description, the first and second semiconductor layers SEM1 and SEM2 illustratively align in one direction.

The control unit CTU controls the memory unit MU thus configured. In FIG. 1A, for clarity of illustration, the control unit CTU is connected to the first drain side select gate SGD1 and the first bit line BL1. However, the control unit CTU is connected to various electrodes and wirings described above to control respective potentials (voltages).

Here, the erase operation in the nonvolatile semiconductor memory device 101 is the operation for performing at least one of injection of holes into the charge retention layer of the memory cell MC and extraction of electrons from the charge retention layer. Here, the charge retention layer is a layer for retaining charge in the memory cell MC and illustratively includes a charge storage layer made of an insulating layer and a floating electrode made of a conductive layer. The charge retention layer is illustratively provided between the channel region and the control gate (gate electrode) of the memory cell MC. A tunnel insulating film is provided between the charge retention layer and the channel region, and a block insulating film is provided between the charge retention layer and the control gate.

(Selective Erase Operation ER)

In the following, a description is given of the operation of the control unit CTU in selective erasure in the nonvolatile semiconductor memory device 101.

As shown in FIG. 1B, in the selective erase operation ER for performing at least one of injection of holes into the charge retention layer of a selected cell transistor CL1 (in this example, third memory cell MC3) of the first memory transistors MC1A (in this example, first to fourth memory cells MC1 to MC4) and extraction of electrons from the charge retention layer, the control unit CTU performs the following operation.

The control unit CTU applies a first voltage V1 to the first bit line BL1. The first voltage V1 is illustratively a high voltage Vpp. The high voltage Vpp is illustratively set to 20 volts (V).

Furthermore, the control unit CTU applies a second voltage V2 lower than the first voltage V1 to the selected cell gate (control gate CG1-3) of the selected cell transistor CL1. The second voltage V2 is illustratively 0 volts (0 V, or ground potential, which may be a reference potential).

Furthermore, the control unit CTU applies a third voltage V3 not higher than the first voltage V1 and higher than the second voltage V2 to the non-selected cell gates (in this example, control gate CG1-1, control gate CG1-2, and control gate CG1-4) of the first memory transistors MC1A (in this example, first memory cell MC1, second memory cell MC2, and fourth memory cell MC4) other than the selected cell transistor CL1. The third voltage V3 is illustratively a medium voltage Vm between the high voltage Vpp and 0 V. The medium voltage Vm is illustratively set to 10 V.

Furthermore, the control unit CTU applies the first voltage V1 (high voltage Vpp) or a fourth voltage V4 not higher than the first voltage V1 and not lower than the third voltage V3 to the first drain side select gate SGD1 of the first drain side select transistor SDT1. The fourth voltage V4 is illustratively the medium voltage Vm. In the following description, the medium voltage Vm is illustratively used as the fourth voltage V4.

Furthermore, the control unit CTU applies a fifth voltage V5 higher than the second voltage V2 and not higher than the third voltage V3 to the second bit line BL2 or sets the second bit line BL2 in a floating state OPN. The fifth voltage V5 is illustratively a low voltage Vcc, which is a voltage higher than the second voltage V2 (0 V) and not higher than the third voltage V3 (medium voltage Vm). The low voltage Vcc is illustratively set to 3 V. Alternatively, the control unit CTU may apply the second voltage V2 (0 V) to the second bit line BL2.

In this example, the first source line SL1 is subjected to the first voltage V1 (high voltage Vpp), the low voltage Vcc, or the second voltage V2 (0 V), or the first source line SL1 is set in the floating state OPN. Furthermore, the first source side select gate SGS1 is subjected to the first voltage V1 (high voltage Vpp) or the fourth voltage V4 (medium voltage Vm), which is equal to the voltage applied to the first drain side select gate SGD1. Furthermore, the second source line SL2 is subjected to the second voltage (0 V) or the fifth voltage V5 (low voltage Vcc), which is equal to the voltage applied to the second bit line BL2.

Here, the same voltage as the voltage applied to the control gate (control gates CG1-1 to CG1-4) of the first memory string MCS1 is applied to the control gate of each of the fifth to eighth memory cells MC5 to MC8 of the second memory string MCS2 because the second memory string MCS2 shares the control gate (control gates CG1-1 to CG1-4) with the first memory string MCS1.

As described above, the selected cell gate (control gate CG1-3) of the selected cell transistor CL1 is subjected to 0 V, and the first bit line BL1 and the first source line SL1 are subjected to the high voltage Vpp. This results in performing at least one of injection of holes into the charge retention layer of the third memory cell MC3 and extraction of electrons from the charge retention layer. That is, the third memory cell MC3 is erased.

Furthermore, the voltage of the non-selected cell gates (control gate CG1-1, control gate CG1-2, and control gate CG1-4) of the first memory cell MC1, the second memory cell MC2, and the fourth memory cell MC4, which are not selected, is set to the third voltage V3 (medium voltage Vm), and hence these cells are not erased.

In the second memory string MCS2 sharing control gates with the first memory string MCS1, the low voltage Vcc is applied to the second bit line BL2 and the second source line SL2. This suppresses erroneous writing in the fifth, sixth, and eighth memory cells MC5, MC6, and MC8, and no erasure is performed on the seventh memory cell MC7 sharing the control gate with the third memory cell MC3 because the applied voltage is low.

Setting to this potential relationship (voltage relationship) enables only the selected cell transistor CL1 to be erased, with the other memory cells (non-selected cell transistors) prevented from erasure or erroneous writing. Selective erasure by this operation can improve the operational reliability of the nonvolatile semiconductor memory device 101. Further, it is possible to rewrite data at high speed by selective erasure.

In the case where the medium voltage Vm is a voltage low enough to avoid writing, the second bit line BL2 and the second source line SL2 of the non-selected second memory string MCS2 may be subjected to the second voltage V2 (0 V).

Furthermore, as shown in FIG. 1A, the memory unit MU further includes a third memory string MCS3.

The third memory string MCS3 includes a third memory cell group MCG3 and a third select transistor SGT31. In the following description, a third drain side select transistor SDT3 is illustratively used as the third select transistor SGT31.

The third memory cell group MCG3 includes a plurality of third memory transistors MC3A (which are memory cells MC, such as ninth to twelfth memory cells MC9 to MC12) connected in series. Each of the plurality of third memory transistors MC3A allows its data to be electrically rewritten.

Each of the plurality of third memory transistors MC3A includes a third semiconductor layer SEM3. The third semiconductor layer SEM3 is electrically isolated from the first semiconductor layer SEM1 and the second semiconductor layer SEM2. Each of the plurality of third memory transistors MC3A includes a channel formed in the third semiconductor layer SEM3. Each of the plurality of third memory transistors MC3A (ninth to twelfth memory cells MC9 to MC12) includes a second control gate CG2A (control gates CG2-1 to CG2-4).

The third drain side select transistor SDT3 is provided on one end side of the third memory cell group MCG3. The third drain side select transistor SDT3 includes the same third semiconductor layer SEM3 as the third memory cell group MCG3. That is, the third drain side select transistor SDT3 includes a channel formed in the third semiconductor layer SEM3. The third drain side select transistor SDT3 includes a second select gate SG21. In the following description, a second drain side select gate SGD2 is illustratively used as the second select gate SG21.

Here, the second drain side select gate SGD2 is electrically isolated from the first drain side select gate SGD1.

The first bit line BL1 is connected to the third semiconductor layer SEM3 on the opposite side of the third drain side select transistor SDT3 from the third memory cell group MCG3. That is, one end of the first semiconductor layer SEM1 and one end of the third semiconductor layer SEM3 are commonly connected to the first bit line BL1.

The third memory string MCS3 further includes a third other select transistor SGT32 provided on the opposite side of the third memory cell group MCG3 from the third drain side select transistor SDT3. In the following description, a third source side select transistor SST3 is illustratively used as the third other select transistor SGT32.

The third source side select transistor SST3 includes the third semiconductor layer SEM3. The third source side select transistor SST3 includes a second other select gate SG22. In the following description, a second source side select gate SGS2 is illustratively used as the second other select gate SG22.

The first source line SL1 is connected to the third semiconductor layer SEM3 on the opposite side of the third source side select transistor SST3 from the third memory cell group MCG3. That is, the first source line SL1 functions as a source line SL in the third memory string MCS3, as well as functioning as a source line SL in the first memory string MCS1.

The control unit CTU further performs the following operation in the selective erase operation.

When the selected cell transistor CL1 of the first memory transistors MC1A is selectively erased, the second control gates CG2A (control gates CG2-1 to CG2-4) of the third memory transistors MC3A are subjected to the third voltage V3 (medium voltage Vm) or a sixth voltage V6 lower than the third voltage V3. The sixth voltage V6 can be equal to the second voltage V2, such as 0 V.

Furthermore, the second drain side select gate SGD2 of the third drain side select transistor SDT3 is subjected to a seventh voltage V7 lower than the third voltage V3. The seventh voltage V7 can be equal to the second voltage V2, such as 0 V.

Here, the first bit line BL1 connected to the third semiconductor layer SEM3 of the third memory string MCS3 is subjected to the first voltage V1 (high voltage Vpp), and the second bit line BL2 is subjected to the fifth voltage V5 (low voltage Vcc) or 0 V or is set in the floating state OPN.

Hence, no data in the third memory transistors MC3A (ninth to twelfth memory cells MC9 to MC12) of the third memory string MCS3 is rewritten.

Furthermore, as shown in FIG. 1A, the memory unit MU further includes a fourth memory string MCS4.

The fourth memory string MCS4 includes a fourth memory cell group MCG4 and a fourth select transistor SGT41. In the following description, a fourth drain side select transistor SDT4 is illustratively used as the fourth select transistor SGT41.

The fourth memory cell group MCG4 includes a plurality of fourth memory transistors MC4A (which are memory cells MC, such as thirteenth to sixteenth memory cells MC13 to MC16) connected in series. Each of the plurality of fourth memory transistors MC4A allows its data to be electrically rewritten.

The plurality of fourth memory transistors MC4A (thirteenth to sixteenth memory cells MC13 to MC16) include a fourth semiconductor layer SEM4. The fourth semiconductor layer SEM4 is electrically isolated from the first semiconductor layer SEM1, the second semiconductor layer SEM2, and the third semiconductor layer SEM3. Each of the plurality of fourth memory transistors MC4A includes a channel formed in the fourth semiconductor layer SEM4. The respective control gates of the plurality of fourth memory transistors MC4A (thirteenth to sixteenth memory cells MC13 to MC16) are commonly connected to the second control gates CG2A (control gates CG2-1 to CG2-4) of the plurality of third memory transistors MC3A (ninth to twelfth memory cells MC9 to MC12).

The fourth drain side select transistor SDT4 is provided on one end side of the fourth memory cell group MCG4. The fourth drain side select transistor SDT4 includes the same fourth semiconductor layer SEM4 as the fourth memory cell group MCG4. That is, the fourth drain side select transistor SDT4 includes a channel formed in the fourth semiconductor layer SEM4. The select gate of the fourth drain side select transistor SDT4 is connected to the second drain side select gate SGD2.

The second bit line BL2 is connected to the fourth semiconductor layer SEM4 on the opposite side of the fourth drain side select transistor SDT4 from the fourth memory cell group MCG4 (thirteenth to sixteenth memory cells MC13 to MC16). That is, one end of the second semiconductor layer SEM2 and one end of the fourth semiconductor layer SEM4 are commonly connected to the second bit line BL2.

The fourth memory string MCS4 further includes a fourth other select transistor SGT42 provided on the opposite side of the fourth memory cell group MCG4 from the fourth drain side select transistor SDT4. In the following description, a fourth source side select transistor SST4 is illustratively used as the fourth other select transistor SGT42.

The fourth source side select transistor SST4 includes the fourth semiconductor layer SEM4. The select gate of the fourth source side select transistor SST4 is connected to the second source side select gate SGS2.

The second source line SL2 is connected to the fourth semiconductor layer SEM4 on the opposite side of the fourth source side select transistor SST4 from the fourth memory cell group MCG4. That is, the second source line SL2 functions as a source line SL in the fourth memory string MCS4, as well as functioning as a source line SL in the second memory string MCS2.

Also in this fourth memory string MCS4, the control gates CG2-1 to CG2-4 shared with the third memory string MCS3 are subjected to the sixth voltage V6 (e.g., equal to the second voltage V2, or 0 V).

Furthermore, the select gate of the fourth drain side select transistor SDT4 is subjected to the seventh voltage V7 (e.g., equal to the second voltage V2, or 0 V) in common with the second drain side select gate SGD2. Here, the second bit line BL2 and the second source line SL2 connected to the fourth semiconductor layer SEM4 of the fourth memory string MCS4 are subjected to the fifth voltage V5 (low voltage Vcc) or the second voltage V2 (0 V) or are set in the floating state OPN.

Hence, no data in the fourth memory transistors MC4A (thirteenth to sixteenth memory cells MC13 to MC16) of the fourth memory string MCS4 is rewritten.

Thus, only the selected cell transistor CL1 can be selectively erased, and the operational reliability of the nonvolatile semiconductor memory device 101 can be improved.

(Write Operation WR)

In the following, a description is given of the operation of the control unit CTU in writing in the nonvolatile semiconductor memory device 101. Here, the write operation is the operation for performing at least one of injection of electrons into the charge retention layer of the memory cell MC and extraction of holes from the charge retention layer.

In the write operation WR in a selected cell transistor CL1 (in this example, third memory cell MC3) of the first memory transistors MC1A (in this example, first to fourth memory cells MC1 to MC4), the control unit CTU performs the following operation.

As shown in FIG. 1B, the control unit CTU applies a high voltage Vpp (e.g., the aforementioned first voltage V1) to the selected cell gate (CG1-3) of the selected cell transistor CL1.

Furthermore, the first bit line BL1 is subjected to 0 V (e.g., the second voltage V2 lower than the aforementioned first voltage V1).

The non-selected cell gates (control gate CG1-1, control gate CG1-2, and control gate CG1-4) of the first memory transistors MC1A (first memory cell MC1, second memory cell MC2, and fourth memory cell MC4) other than the selected cell transistor CL1 are subjected to a voltage (e.g., low voltage Vcc) higher than the second voltage V2 and not higher than the third voltage V3.

The first drain side select gate SGD1 of the first drain side select transistor SDT1 is subjected to a voltage (e.g., low voltage Vcc) higher than the second voltage V2 and not higher than the third voltage V3.

The second bit line BL2 is subjected to a voltage (e.g., low voltage Vcc) higher than the second voltage V2 and not higher than the third voltage V3.

Thus, selective writing can be performed on the selected cell transistor CL1.

In the write operation WR, the control unit CTU can further perform the following operation.

The first source line SL1 and the second source line SL2 are subjected to 0 V (e.g., second voltage V2) or a low voltage Vcc, or the first source line SL1 and the second source line SL2 are set in the floating state OPN. Furthermore, the first source side select gate SGS1 of the first memory string MCS1 is also subjected to 0 V (e.g., second voltage V2).

Furthermore, in the write operation WR, the control unit CTU applies 0 V (e.g., a voltage lower than the aforementioned third voltage V3, such as the second voltage V2) to the second control gates CG2A (control gates CG2-1 to CG2-4) of the third memory transistors MC3A (ninth to twelfth memory cells MC9 to MC12).

Furthermore, the second drain side select gate SGD2 of the third drain side select transistor SDT3 is subjected to a voltage lower than the third voltage V3 (e.g., 0 V).

Here, the second source side select gate SGS2 of the third memory string MCS3 is subjected to a voltage lower than the third voltage V3 (e.g., 0 V).

Thus, erroneous writing in the third memory transistors MC3A (ninth to twelfth memory cells MC9 to MC12) of the third memory string MCS3 can be prevented.

In the fourth memory string MCS4, the select gate of the fourth drain side select transistor SDT4 is subjected to the same voltage (0 V) as the second drain side select gate SGD2, and the select gate of the fourth source side select transistor SST4 is subjected to the same voltage (0 V) as the second source side select gate SGS2. This can prevent erroneous writing in the fourth memory transistors MC4A (thirteenth to sixteenth memory cells MC13 to MC16) of the fourth memory string MCS4.

(Read Operation RD)

In the following, a description is given of the operation of the control unit CTU in the read operation RD in the nonvolatile semiconductor memory device 101.

As shown in FIG. 1B, the control unit CTU applies a reading bit line voltage Ve not higher than the fifth voltage V5 (e.g., low voltage Vcc) and higher than the second voltage V2 (e.g., 0 V) to the first bit line BL1. The reading bit line voltage Ve can illustratively be 1 V to 2 V.

The selected cell gate (control gate CG1-3) of the selected cell transistor CL1 is subjected to a sense voltage Vse varied between the low voltage Vcc and the second voltage V2 (e.g., 0 V). The sense voltage Vse is the voltage of an electrical signal for sensing the threshold voltage of the memory cell MC.

The non-selected cell gates (control gate CG1-1, control gate CG1-2, and control gate CG1-4) of the first memory transistors MC1A (first memory cell MC1, second memory cell MC2, and fourth memory cell MC4) other than the selected cell transistor CL1 are subjected to the low voltage Vcc.

The first drain side select gate SGD1 of the first drain side select transistor SDT1 is subjected to the low voltage Vcc.

The second bit line BL2 is subjected to the second voltage V2 (e.g., 0 V).

Thus, without erroneous writing in the memory cell MC of the first memory string MCS1, the data written in the memory cell MC can be read.

In the read operation RD, the control unit CTU can further perform the following operation.

The first source line SL1 and the second source line SL2 are subjected to the second voltage V2 (e.g., 0 V). Furthermore, the first source side select gate SGS1 of the first memory string MCS1 is illustratively subjected to the low voltage Vcc.

Furthermore, the control unit CTU illustratively applies 0 V (second voltage V2) to the second control gates CG2A (control gates CG2-1 to CG2-4) of the third memory transistors MC3A (ninth to twelfth memory cells MC9 to MC12).

Furthermore, the second drain side select gate SGD2 of the third drain side select transistor SDT3 is illustratively subjected to 0 V (second voltage V2).

Here, the second source side select gate SGS2 of the third memory string MCS3 is also subjected to 0 V.

Thus, erroneous writing in the third memory transistors MC3A (ninth to twelfth memory cells MC9 to MC12) of the third memory string MCS3 can be prevented.

In the fourth memory string MCS4, the select gate of the fourth drain side select transistor SDT4 is subjected to 0 V, which is equal to the voltage applied to the second drain side select gate SGD2, and the select gate of the fourth source side select transistor SST4 is subjected to 0 V, which is equal to the voltage applied to the second source side select gate SGS2. This can prevent erroneous writing in the fourth memory transistors MC4A (thirteenth to sixteenth memory cells MC13 to MC16) of the fourth memory string MCS4.

FIRST PRACTICAL EXAMPLE

In the following, a nonvolatile semiconductor memory device 110 of a first practical example according to the first embodiment is described.

Figure 2:
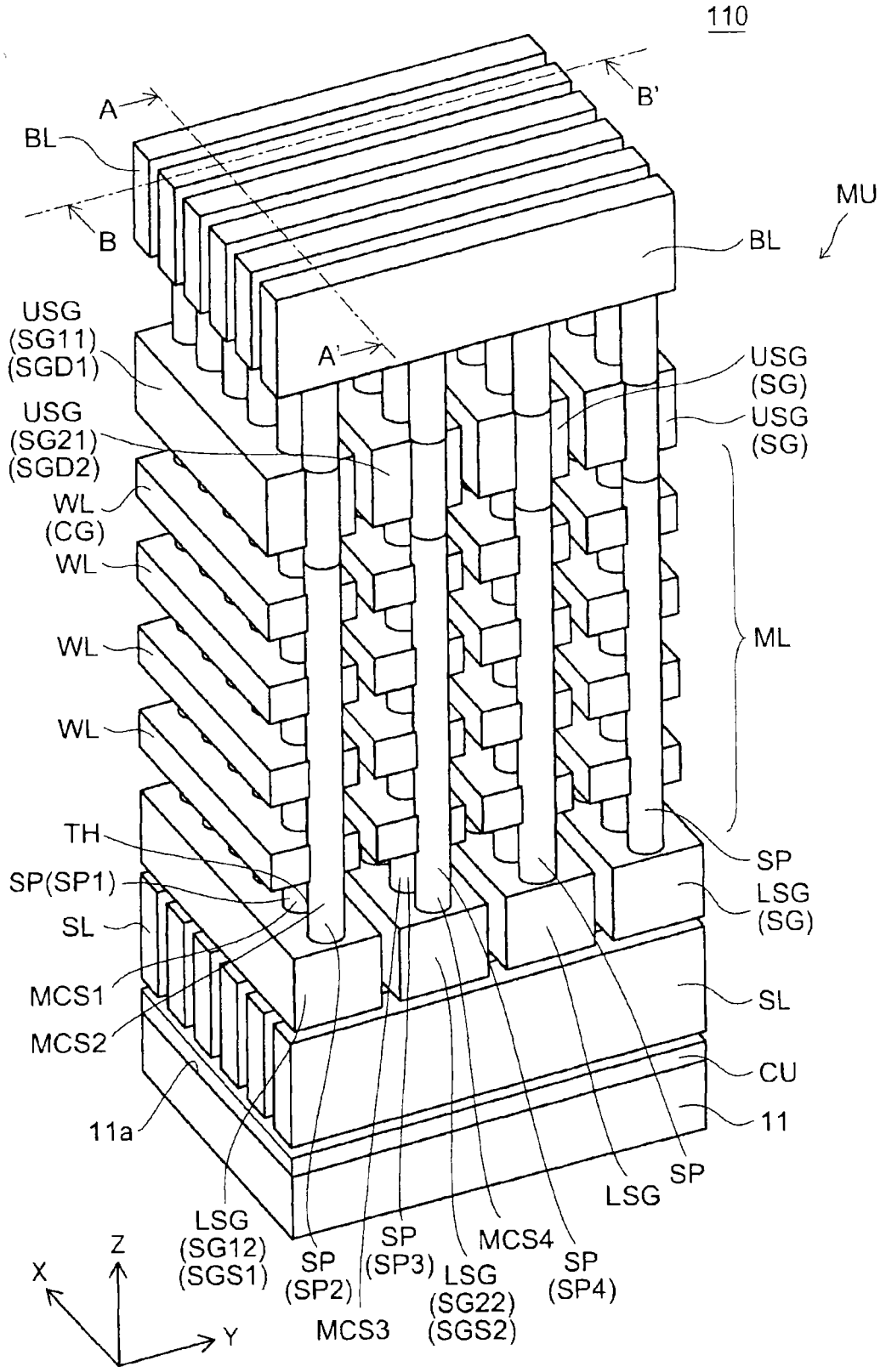
FIG. 2 is a schematic perspective view illustrating the configuration of a nonvolatile semiconductor memory device according to a first practical example.
Figure 3:
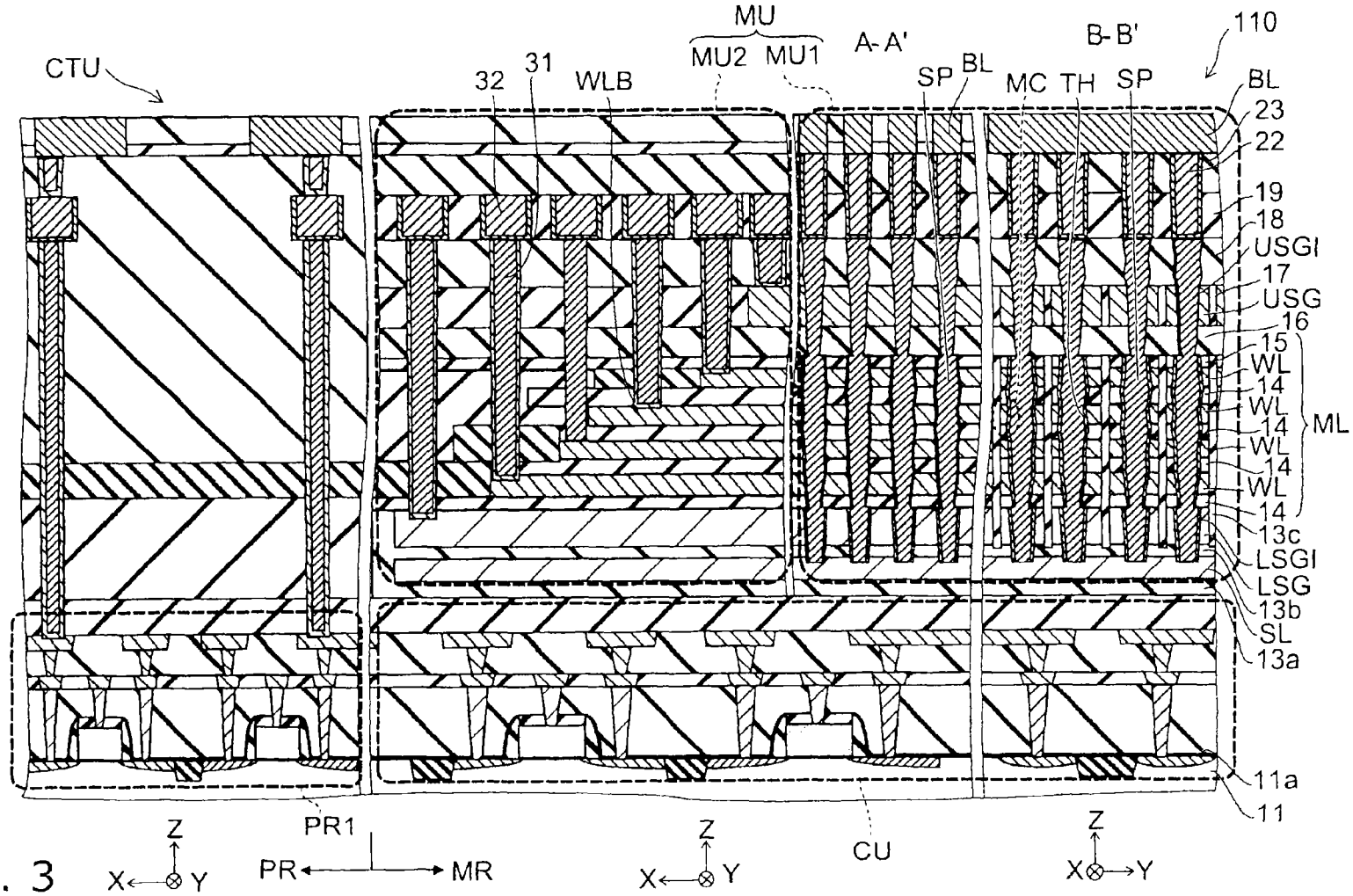
FIG. 3 is a schematic cross-sectional view illustrating the configuration of the nonvolatile semiconductor memory device according to the first practical example.
Figure 4:
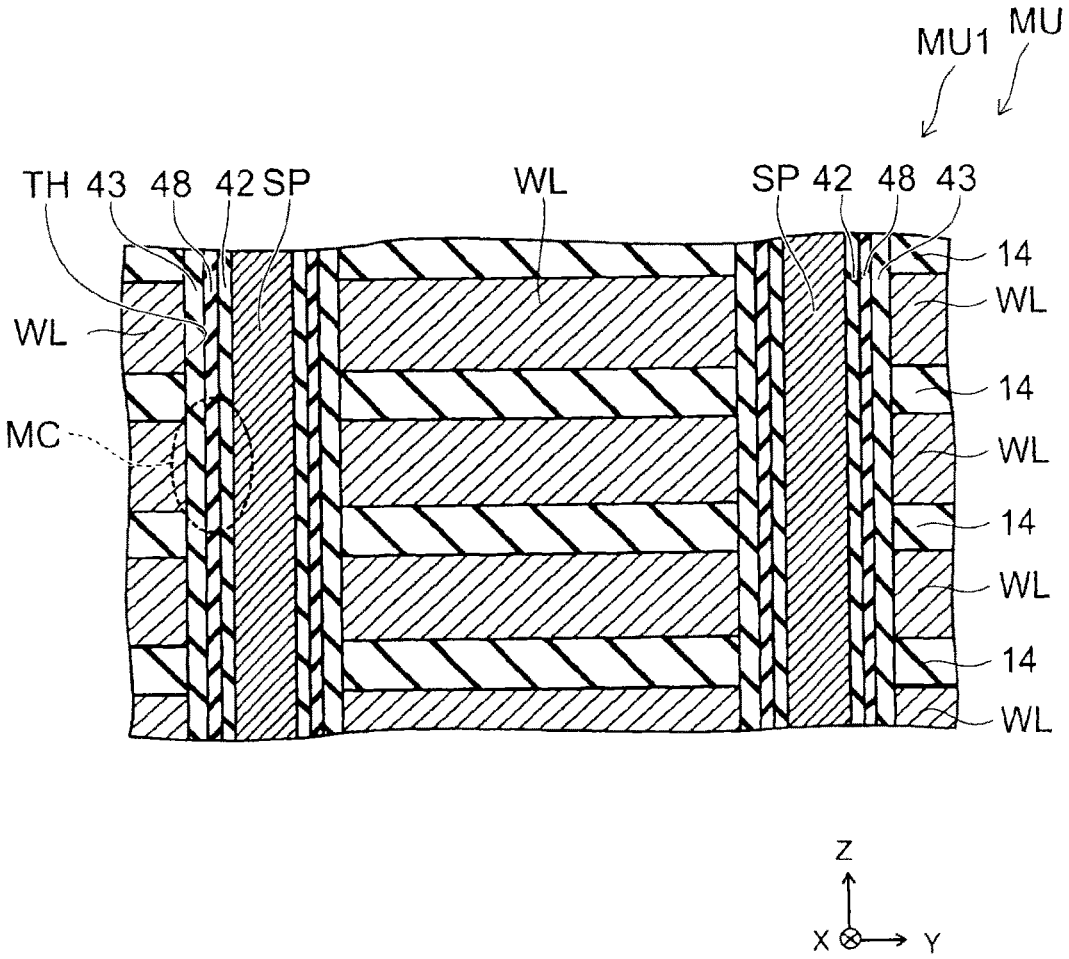
FIG. 4 is a schematic partial cross-sectional view illustrating the configuration of the nonvolatile semiconductor memory device according to the first practical example.

FIGS. 2, 3, and 4 are a schematic perspective view, a schematic cross-sectional view, and a schematic partial cross-sectional view, respectively, illustrating the configuration of the nonvolatile semiconductor memory device according to the first practical example.

It is noted that for clarity of illustration, FIG. 2 shows only the conductive portions and omits the insulating portions.

As shown in FIGS. 2 and 3, the nonvolatile semiconductor memory device 110 according to this practical example includes a memory unit MU and a control unit CTU. The memory unit MU and the control unit CTU are provided on the major surface 11a of a substrate 11 illustratively made of single crystal silicon. However, the control unit CTU may be provided on a substrate different from the substrate on which the memory unit MU is provided. In the following description, it is assumed that the memory unit MU and the control unit CTU are provided on the same substrate (substrate 11).

On the substrate 11, for instance, a memory array region MR to be provided with memory cells and a peripheral region PR illustratively provided around the memory array region MR are defined. In the peripheral region PR, various peripheral region circuits PR1 are provided on the substrate 11.

In the memory array region MR, a circuit unit CU is illustratively provided on the substrate 11, and the memory unit MU is provided on the circuit unit CU. It is noted that the circuit unit CU is provided as needed and can be omitted. An interlayer insulating film 13a illustratively made of silicon oxide is provided between the circuit unit CU and the memory unit MU.

At least part of the control unit CTU, for instance, can illustratively be provided in at least one of the peripheral region circuit PR1 and the circuit unit CU described above.

The memory unit MU includes a matrix memory cell unit MU1 including a plurality of memory transistors and a wiring connecting unit MU2 for connecting wirings in the matrix memory cell unit MU1.

FIG. 2 illustrates the configuration of the matrix memory cell unit MU1.

With regard to the matrix memory cell unit MU1, FIG. 3 illustrates part of the A-A' cross section of FIG. 2 and part of the B-B' cross section of FIG. 2.

As shown in FIGS. 2 and 3, in the matrix memory cell unit MU1, a multilayer structure ML is provided on the major surface 11a of the substrate 11. The multilayer structure ML includes a plurality of electrode films WL and a plurality of interelectrode insulating films 14 alternately stacked in the direction perpendicular to the major surface 11a.

For convenience of description, the direction perpendicular to the major surface 11a of the substrate 11 is referred to as a Z-axis direction (first direction). Furthermore, one of the directions in the plane parallel to the major surface 11a is referred to as a Y-axis direction (second direction). Furthermore, the direction perpendicular to the Z axis and the Y axis is referred to as an X-axis direction (third direction).

The stacking direction of the electrode films WL and the interelectrode insulating films 14 in the multilayer structure ML is the Z-axis direction. That is, the electrode films WL and the interelectrode insulating films 14 are provided parallel to the major surface 11a. The electrode films WL are illustratively divided into erase blocks.

FIG. 4 illustrates the configuration of the matrix memory cell unit MU1, illustratively corresponding to part of the B-B' cross section of FIG. 3.

As shown in FIGS. 3 and 4, the memory unit MU of the nonvolatile semiconductor memory device 110 includes the aforementioned multilayer structure ML, a semiconductor pillar SP (first semiconductor pillar SP1) piercing the multilayer structure ML in the Z-axis direction, a memory layer 48, an inner insulating film 42, and an outer insulating film 43.

The memory layer 48 is provided between each of the electrode films WL and the semiconductor pillar SP. The inner insulating film 42 is provided between the memory layer 48 and the semiconductor pillar SP. The outer insulating film 43 is provided between each of the electrode films WL and the memory layer 48.

More specifically, the outer insulating film 43, the memory layer 48, and the inner insulating film 42 are formed in this order on the inner wall surface of the through hole TH piercing the multilayer structure ML in the Z-axis direction, and the remaining space is filled with a semiconductor to form the semiconductor pillar SP.

A memory cell MC is provided at the intersection between the electrode film WL of the multilayer structure ML and the semiconductor pillar SP. That is, memory transistors including the memory layer 48 are provided in a three-dimensional matrix, each at the intersection between the electrode film WL and the semiconductor pillar SP. Each of the memory transistors functions as a memory cell MC for storing data by storing charge in the memory layer 48.

The semiconductor pillars SP constitute the first to fourth semiconductor layers SEM1 to SEM4. The memory transistors formed in the semiconductor pillars SP constitute the first to fourth memory cell groups MCG1 to MCG4.

The inner insulating film 42 functions as a tunnel insulating film in the memory transistor of the memory cell MC. On the other hand, the outer insulating film 43 functions as a block insulating film in the memory transistor of the memory cell MC. The interelectrode insulating film 14 functions as an interlayer insulating film for insulating the electrode films WL from each other.

The electrode film WL can be made of any conductive material, such as amorphous silicon or polysilicon provided with conductivity by impurity doping, or can be made of metals and alloys. A prescribed electrical signal is applied to the electrode film WL, which functions as a word line of the nonvolatile semiconductor memory device 110.

The interelectrode insulating film 14, the inner insulating film 42, and the outer insulating film 43 can illustratively be silicon oxide films. It is noted that the interelectrode insulating film 14, the inner insulating film 42, and the outer insulating film 43 may be a monolayer film or a multilayer film.

The memory layer 48 can illustratively be a silicon nitride film and functions as a portion for storing data by storing or releasing charge by an electric field applied between the semiconductor pillar SP and the electrode film WL. The memory layer 48 may be a monolayer film or a multilayer film.

As described later, the interelectrode insulating film 14, the inner insulating film 42, the memory layer 48, and the outer insulating film 43 can be made of any material, not limited to the materials illustrated above.

Although FIGS. 2 and 3 illustrate the case where the multilayer structure ML includes four electrode films WL, the number of electrode films WL provided in the multilayer structure ML is arbitrary. In the following description, it is assumed that the number of electrode films WL is four.

Furthermore, select gates SG are provided above and below the multilayer structure ML.

More specifically, an upper select gate USG (illustratively serving as a drain side select gate) is provided above the multilayer structure ML, and a lower select gate LSG (illustratively serving as a source side select gate) is provided below the multilayer structure ML.

An upper select gate insulating film USGI illustratively made of silicon oxide is provided between the upper select gate USG and the semiconductor pillar SP, and a lower select gate insulating film LSGI illustratively made of silicon oxide is provided between the lower select gate LSG and the semiconductor pillar SP.

Furthermore, a source line SL is provided below the lower select gate LSG. An interlayer insulating film 13a is provided below the source line SL, and an interlayer insulating film 13b is provided between the source line SL and the lower select gate LSG.

The semiconductor pillar SP is connected to the source line SL below the lower select gate LSG and to a bit line BL above the upper select gate USG.

The upper select gate USG and the lower select gate LSG are divided in the Y-axis direction by an interlayer insulating film 17 and an interlayer insulating film 13c, respectively, and shaped like strips aligning along the X-axis direction.

The aforementioned select gates SG (upper select gate USG and lower select gate LSG) can be made of any conductive material, such as polysilicon or amorphous silicon.

On the other hand, the bit line BL connected to the upper portion of the semiconductor pillar SP and the source line SL connected to the lower portion of the semiconductor pillar SP are shaped like strips aligning in the Y-axis direction.

In this case, the electrode film WL is a conductive film shaped like a strip aligning in the X-axis direction.

One of the upper select gates USG constitutes the first drain side select gate SGD1, and another of the upper select gates USG constitutes the second drain side select gate SGD2. One of the lower select gates LSG constitutes the first source side select gate SGS1, and another of the lower select gates LSG constitutes the second source side select gate SGS2.

The first drain side select transistor SDT1 is provided at the intersection between the first semiconductor pillar SP1 and the first drain side select gate SGD1. The second drain side select transistor SDT2 is provided at the intersection between the second semiconductor pillar SP2 and the first drain side select gate SGD1. The third drain side select transistor SDT3 is provided at the intersection between the third semiconductor pillar SP3 and the second drain side select gate SGD2. The fourth drain side select transistor SDT4 is provided at the intersection between the fourth semiconductor pillar SP4 and the second drain side select gate SGD2.

The first to fourth memory strings MCS1 to MCS4 are formed on the basis of the first to fourth semiconductor pillars SP1 to SP4.

In the nonvolatile semiconductor memory device 110, the control unit CTU performs the operation illustrated in FIG. 1B. Thus, the selective erase operation ER can be performed, and the operational reliability can be improved. Further, it is possible to rewrite data at high speed by selective erasure. Furthermore, the desired operation can be performed by the write operation WR and the read operation RD illustrated in FIG. 1B.

In the nonvolatile semiconductor memory device 110, the semiconductor pillars SP are illustratively used as the first to fourth semiconductor layers SEM1 to SEM4, which align in the direction perpendicular to the major surface 11a of the substrate 11. However, the first to fourth semiconductor layers SEM1 to SEM4 may illustratively be made of a material, such as SOI, aligning in the direction parallel to the major surface 11a of the substrate 11.

Second Embodiment

Figure 5:
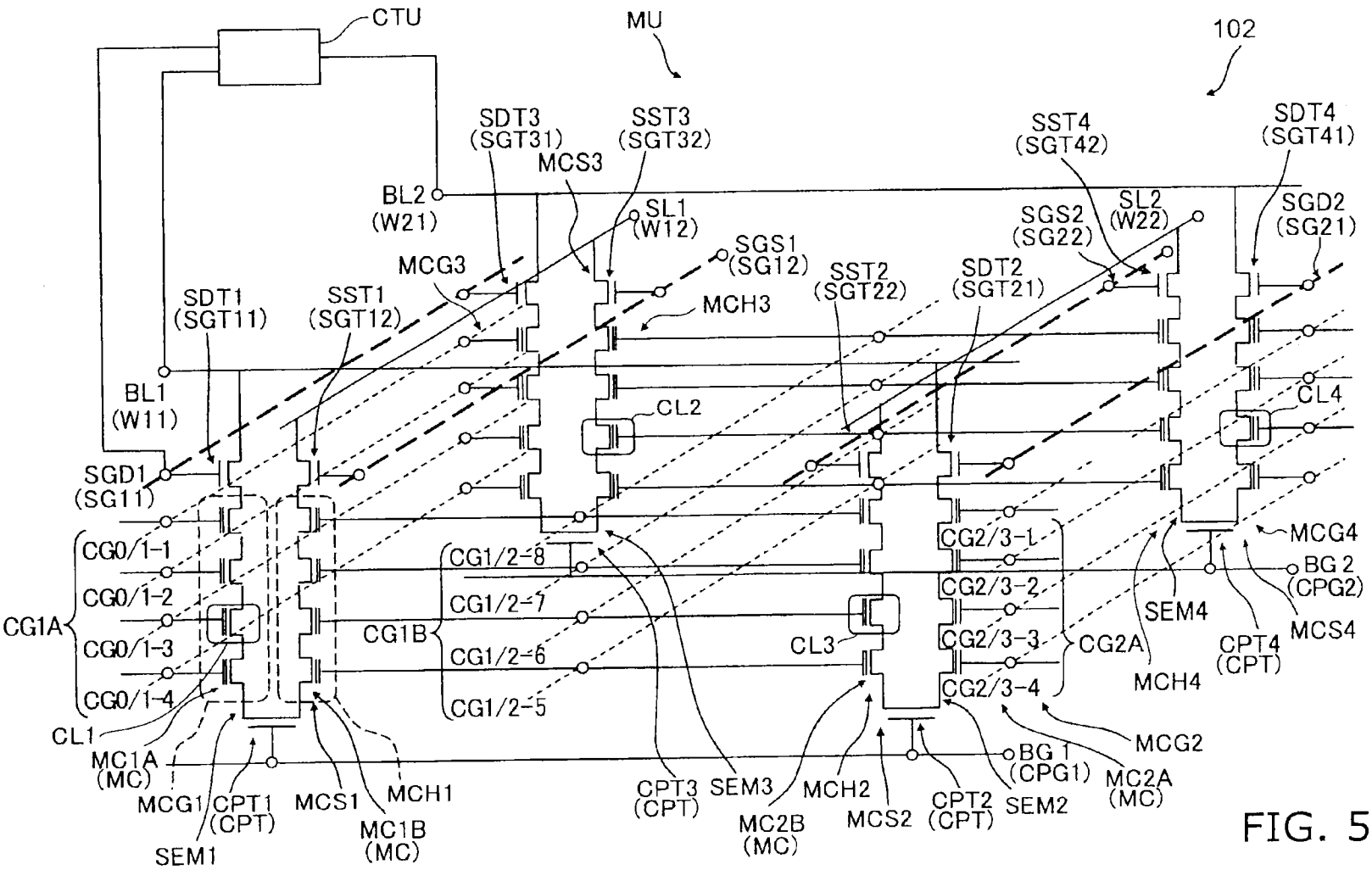
FIG. 5 is a schematic diagram illustrating the configuration of a nonvolatile semiconductor memory device according to a second embodiment.

FIG. 5 is a schematic diagram illustrating the configuration of a nonvolatile semiconductor memory device according to a second embodiment. More specifically, FIG. 5 is a circuit diagram illustrating the configuration of a nonvolatile semiconductor memory device 102. In FIG. 5, for clarity of illustration, some wirings are not shown.

FIG. 6 is a table illustrating the operation of the nonvolatile semiconductor memory device according to the second embodiment.

As shown in FIG. 5, the nonvolatile semiconductor memory device 102 according to this embodiment includes a connecting portion transistor CPT (first to fourth connecting portion transistors CPT1 to CPT4) halfway through each of the memory strings (first to fourth memory strings MCS1 to MCS4) of the nonvolatile semiconductor memory device 101 illustrated in FIG. 1. Each of the memory strings illustratively has a folded structure.

In the nonvolatile semiconductor memory device 102, the memory unit MU further includes a first source line SL1 and a second source line SL2 in addition to the first memory string MCS1, the first bit line BL1, the second memory string MCS2, and the second bit line BL2.

In addition to the first memory cell group MCG1 and the first drain side select transistor SDT1, the first memory string MCS1 further includes a first other memory cell group MCH1, a first source side select transistor SST1, and a first connecting portion transistor CPT1.

The first source side select transistor SST1 is provided on the opposite side of the first memory cell group MCG1 from the first drain side select transistor SDT1. The first source side select transistor SST1 includes a channel formed in the first semiconductor layer SEM1 and includes a first source side select gate SGS1.

The first connecting portion transistor CPT1 is provided between the first memory cell group MCG1 and the first source side select transistor SST1, includes a channel formed in the first semiconductor layer SEM1, and includes a first connecting portion gate CPG1. In the following description, a first back gate BG1 is illustratively used as the first connecting portion gate CPG1.

The first other memory cell group MCH1 is provided between the first source side select transistor SST1 and the first connecting portion transistor CPT1 and includes a plurality of first other memory transistors MC1B (memory cells MC) connected in series. As described previously, the first memory cell group MCG1 includes the first memory transistors MC1A (memory cells MC).

Each of the plurality of first other memory transistors MC1B includes a channel formed in the first semiconductor layer SEM1, includes a first other control gate CG1B (control gates CG1/2-5 to CG1/2-8), and allows its data to be electrically rewritten.

The first source line SL1 is connected to the first semiconductor layer SEM1 on the opposite side of the first source side select transistor SST1 from the first other memory cell group MCH1.

In this embodiment, the first control gates CG1A of the first memory cell group MCG1 are control gates CG0/1-1 to CG0/1-4.

Furthermore, in addition to the second memory cell group MCG2 and the second drain side select transistor SDT2, the second memory string MCS2 further includes a second other memory cell group MCH2, a second source side select transistor SST2, and a second connecting portion transistor CPT2.

The second source side select transistor SST2 is provided on the opposite side of the second memory cell group MCG2 from the second drain side select transistor SDT2, includes a channel formed in the second semiconductor layer SEM2, and includes a second source side select gate SGS2.

The second connecting portion transistor CPT2 is provided between the second memory cell group MCG2 and the second source side select transistor SST2, includes a channel formed in the second semiconductor layer SEM2, and includes a connecting portion gate electrically connected to the first back gate BG1.

The second other memory cell group MCH2 is provided between the second source side select transistor SST2 and the second connecting portion transistor CPT2 and includes a plurality of second other memory transistors MC2B (memory cells MC) connected in series. As described previously, the second memory cell group MCG2 includes the second memory transistors MC2A (memory cells MC).

Each of the plurality of second other memory transistors MC2B includes a channel formed in the second semiconductor layer SEM2, includes a control gate (second other control gate) electrically connected to the first other control gate CG1B, and allows its data to be electrically rewritten.

The second source line SL2 is connected to the second semiconductor layer SEM2 on the opposite side of the second source side select transistor SST2 from the second other memory cell group MCH2.

(Selective Erase Operation ER)

In the following, a description is given of the operation of the control unit CTU in selective erasure in the nonvolatile semiconductor memory device 102.

In the selective erase operation ER on the charge retention layer of a selected cell transistor CL1 of the first memory transistors MC1A (memory cells MC belonging to the first memory cell group MCG1), the control unit CTU performs the following operation. Here, this selected cell transistor CL1 includes the control gate CG1-3.

As shown in FIG. 6, the control unit CTU applies a first voltage V1 (high voltage Vpp, such as 20 V) to the first bit line BL1.

Furthermore, the selected cell gate (control gate CG0/1-3) of the selected cell transistor CL1 is subjected to a second voltage V2 (e.g., 0 V) lower than the first voltage V1.

The non-selected cell gates (control gate CG0/1-1, control gate CG0/1-2, and control gate CG0/1-4) of the first memory transistors MC1A other than the selected cell transistor CL1 are subjected to a third voltage V3 (a medium voltage Vm between the high voltage Vpp and 0 V, such as 10 V) not higher than the first voltage V1 and higher than the second voltage V2.

The first drain side select gate SGD1 of the first drain side select transistor SDT1 is subjected to the first voltage V1 (high voltage Vpp) or a fourth voltage V4 (e.g., medium voltage Vm) not higher than the first voltage V1 and not lower than the third voltage V3.

The second bit line BL2 is subjected to a fifth voltage V5 (e.g., low voltage Vcc) higher than the second voltage V2 and not higher than the third voltage V3. Here, as described previously, the second bit line BL2 may be subjected to the second voltage V2 (e.g., 0 V).

The control unit CTU applies the fifth voltage V5 (low voltage Vcc) or the second voltage (0 V) to the first source line SL1.

The first other control gate CG1B is subjected to the third voltage V3 (medium voltage Vm).

The first source side select gate SGS1 is subjected to an eighth voltage V8 lower than the third voltage V3. The eighth voltage V8 can illustratively be the second voltage (0 V).

The first back gate BG1 is subjected to a ninth voltage V9 lower than the first voltage V1 (high voltage Vpp) and higher than the second voltage V2 (0 V). The ninth voltage V9 can illustratively be the medium voltage Vm.

The second source line SL2 is subjected to the second voltage V2 (0 V), the second control gates CG2A (control gates CG2/3-1 to CG2/3-4) is subjected to the sixth voltage V6 (0 V) or the third voltage V3 (medium voltage Vm), the second drain side select gate SGD2 is subjected to the eighth voltage V8, and the second source side select gate SGS2 is subjected to the eighth voltage V8.

Under this voltage relationship, the first drain side select transistor SDT1 is turned on, and the semiconductor pillar SP is charged. Thus, injection of positive charges or release of electrons, that is, erasure, is performed on the charge retention layer of the selected cell transistor CL1. That is, the threshold voltage of the selected cell transistor CL1 falls below 0 V.

Here, in the memory cell group (in this case, first memory cell group MCG1) including the selected cell transistor CL1, the control gate of the non-selected memory cells is subjected to the medium voltage Vm (e.g., 10 V), and hence the applied electric field is low. Thus, the non-selected memory cells are not erased.

On the other hand, in the memory strings sharing the control gate and select gate with the selected cell transistor CL1 and being adjacent to the memory string including the selected cell transistor CL1, because the second bit line BL2 is subjected to the fifth voltage V5 (low voltage Vcc, or 3 V) or the second voltage (0 V), the electric field applied to the non-selected memory cell in these memory strings is low, and hence no erroneous writing occurs.

Furthermore, in the memory string to which the first bit line BL1 is commonly connected, the select gate SG (second drain side select gate SGD2 and second source side select gate SGS2) is subjected to the eighth voltage V8, or 0 V, thereby cut off. Thus, no erasure occurs.

The control gates (control gates CG1/2-5 to CG1/2-8 of the first other control gate CG1B) shared with the first other memory cell group MCH1 of the selected memory string (first memory string MCS1) are subjected to the medium voltage Vm (e.g., 10 V), and hence the applied electric field is low. Thus, no erroneous writing occurs in the memory cells MC (memory cells included in the second other memory cell group MCH2) associated with the control gates.

Furthermore, as shown in FIG. 5, like the first memory string MCS1, in addition to the third memory cell group MCG3 and the third drain side select transistor SDT3, the third memory string MCS3 further includes a third other memory cell group MCH3, a third source side select transistor SST3, and a third connecting portion transistor CPT3.

Likewise, in addition to the fourth memory cell group MCG4 and the fourth drain side select transistor SDT4, the fourth memory string MCS4 further includes a fourth other memory cell group MCH4, a fourth source side select transistor SST4, and a fourth connecting portion transistor CPT4.

The configuration of the third and fourth other memory cell groups MCH3 and MCH4 and the third and fourth source side select transistors SST3 and SST4 is the same as in the first and second memory strings MCS1 and MCS2, and hence the description thereof is omitted.

The control gates of the third and fourth memory cell groups MCG3 and MCG4 are connected to the first and second control gates CG1A and CG2A of the first and second memory cell groups MCG1 and MCG2, respectively.

The control gates of the third and fourth other memory cell groups MCH3 and MCH4 are connected to the first other control gate CG1B of the first and second other memory cell groups MCH1 and MCH2.

Here, the control gates of the third and fourth drain side select transistors SDT3 and SDT4 are connected to the first and second drain side select gates SGD1 and SGD2 of the first and second drain side select transistors SDT1 and SDT2, respectively.

Furthermore, the control gates of the third and fourth source side select transistors SST3 and SST4 are connected to the first and second source side select gates SGS1 and SGS2 of the first and second source side select transistors SST1 and SST2, respectively.

The third connecting portion transistor CPT3 is provided between the third memory cell group MCG3 and the third source side select transistor SST3, includes a channel formed in the third semiconductor layer SEM3, and includes a second connecting portion gate CPG2. In the following description, a second back gate BG2 is illustratively used as the second connecting portion gate CPG2.

The fourth connecting portion transistor CPT4 is provided between the fourth memory cell group MCG4 and the fourth source side select transistor SST4, includes a channel formed in the fourth semiconductor layer SEM4, and includes a select gate connected to the second connecting portion gate CPG2.

In the case where the nonvolatile semiconductor memory device 102 includes the third and fourth memory strings MCS3 and MCS4 thus configured, in the selective erase operation ER in a selected cell transistor CL1 of the first memory transistors MC1A (memory cells MC belonging to the first memory cell group MCG1), the control unit CTU further applies the second voltage (0 V) to the second back gate BG2.

Under the above voltage relationship, erroneous writing in the third and fourth memory strings MCS3 and MCS4 is suppressed, and the desired selected transistor (in this case, the selected cell transistor CL1 of the first memory transistors MC1A) can be selectively erased.

(Write Operation WR)

In the following, a description is given of the operation of the control unit CTU in the write operation WR in this nonvolatile semiconductor memory device 102.

In the write operation WR in the selected cell transistor CL1 of the first memory transistors MC1A, the control unit CTU performs the following operation.

The control unit CTU applies the second voltage V2 (0 V) to the first bit line BL1. Furthermore, the selected cell gate (control gate CG0/1-3) of the selected cell transistor CL1 is subjected to the first voltage V1 (high voltage Vpp).

The non-selected cell gates (control gate CG0/1-1, control gate CG0/1-2, and control gate CG0/1-4) of the first memory transistors MC1A other than the selected cell transistor CL1 are subjected to the fifth voltage V5 (e.g., low voltage Vcc).

The first drain side select gate SGD1 is subjected to the fifth voltage V5 (low voltage Vcc).

The second bit line BL2 is subjected to the fifth voltage V5 (low voltage Vcc).

Furthermore, the control unit CTU applies the fifth voltage V5 (low voltage Vcc) or the second voltage V2 (0 V) to the first source line SL1 or sets the first source line SL1 in the floating state OPN.

The first other control gate CG1B is subjected to the fifth voltage V5 (low voltage Vcc).

The first source side select gate SGS1 is subjected to the second voltage V2 (0 V).

The first back gate BG1 is subjected to the fifth voltage V5 (low voltage Vcc).

The second source line SL2 is subjected to the second voltage V2 (0 V).

The second control gates CG2A (control gate CG2/3-1 to control gate CG2/3-4) are subjected to the second voltage V2 (0 V) or the fifth voltage (low voltage Vcc).

The second drain side select gate SGD2 is subjected to the second voltage V2 (0 V).

The second source side select gate SGS2 is subjected to the second voltage V2 (0 V).

The second back gate BG2 is subjected to the second voltage (0 V).

Thus, the desired select transistor (in this case, the selected cell transistor CL1 belonging to the first memory transistors MC1A) can be written.

(Read Operation RD)

Furthermore, a description is given of the operation of the control unit CTU in the read operation RD in this nonvolatile semiconductor memory device 102.

In the read operation RD in the selected cell transistor CL1 of the first memory transistors MC1A, the control unit CTU performs the following operation.

The control unit CTU applies a reading bit line voltage Ve lower than the fifth voltage V5 (e.g., low voltage Vcc) and higher than the second voltage V2 (e.g., 0 V) to the first bit line BL1. The reading bit line voltage Ve can illustratively be 1 V to 2 V.

The selected cell gate (control gate CG0/1-3) of the selected cell transistor CL1 is subjected to the sense voltage Vse.

The non-selected cell gates (control gate CG0/1-1, control gate CG0/1-2, and control gate CG0/1-4) of the first memory transistors MC1A other than the selected cell transistor CL1 are subjected to the fifth voltage V5 (low voltage Vcc).

The first drain side select gate SGD1 is subjected to the fifth voltage V5 (low voltage Vcc).

The second bit line BL2 is subjected to the second voltage V2 (0 V).

Furthermore, the control unit CTU applies the second voltage V2 (0 V) to the first source line SL1.

The first other control gate CG1B is subjected to the fifth voltage V5 (low voltage Vcc).

The first source side select gate SGS1 is subjected to the fifth voltage V5 (Vcc).

The first back gate BG1 is subjected to the fifth voltage V5 (low voltage Vcc).

The second source line SL2 is subjected to the second voltage V2 (0 V).

The second control gates CG2A (control gate CG2/3-1 to control gate CG2/3-4) are subjected to the second voltage V2 (0 V).

The second drain side select gate SGD2 is subjected to the second voltage V2 (0 V).

The second source side select gate SGS2 is subjected to the second voltage V2 (0 V).

The second back gate BG2 is subjected to the second voltage (0 V).

Thus, the data stored in the desired select transistor (in this case, the selected cell transistor CL1 belonging to the first memory transistors MC1A) can be read.

Furthermore, as shown in FIG. 5, also in the case where the selected memory cells are the selected cell transistors CL2, CL3, and CL4 belonging, respectively, to the second, third, and fourth memory strings MCS2, MCS3, and MCS4, the voltages under the condition illustrated in FIG. 6 can be used to perform the selective erase operation ER. More specifically, the positions of the first memory cell group MCG1, the first other memory cell group MCH1, the second memory cell group MCG2, the second other memory cell group MCH2, the third memory cell group, the third other memory cell group, the fourth memory cell group, the fourth other memory cell group and the like can be regarded to change with the position of the selected memory cell, and the positions of each wiring, each select gate, each control gate, and each connecting portion gate can be changed accordingly to selectively erase the desired memory cell MC by a similar operation.

Furthermore, the write operation WR and the read operation RD can be performed likewise.

Figure 7:
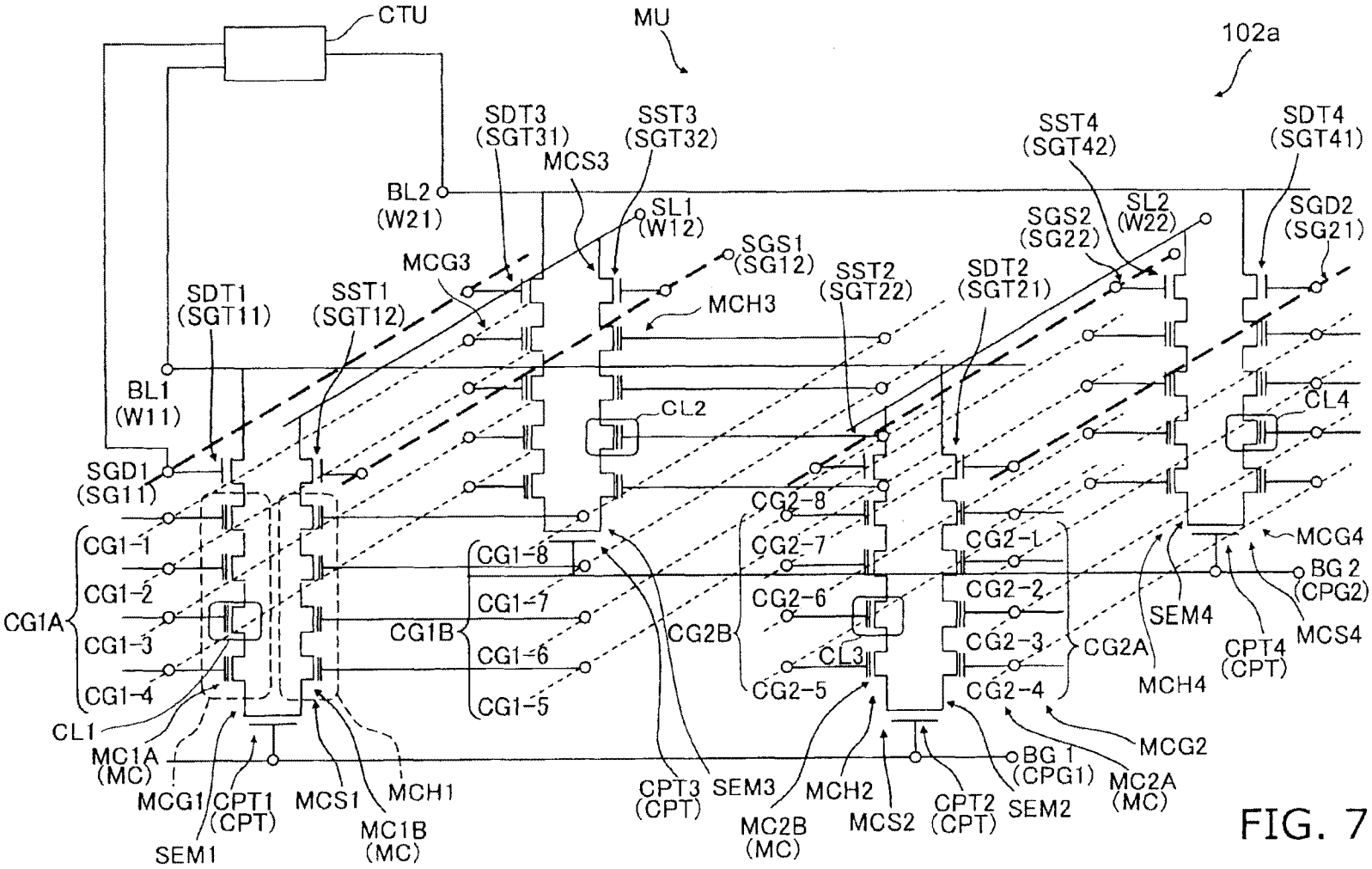
FIG. 7 is a schematic diagram illustrating the configuration of an alternative nonvolatile semiconductor memory device according to the second embodiment.

FIG. 7 is a schematic diagram illustrating the configuration of an alternative nonvolatile semiconductor memory device according to the second embodiment.

More specifically, FIG. 7 is a circuit diagram illustrating the configuration of a nonvolatile semiconductor memory device 102a. In FIG. 7, for clarity of illustration, some wirings are not shown.

FIG. 8 is a table illustrating the operation of the alternative nonvolatile semiconductor memory device according to the second embodiment.

As shown in FIG. 7, in the nonvolatile semiconductor memory device 102a, the first other control gate CG1B and the second other control gate CG2B are not common and are independent of each other. The rest is same as the nonvolatile semiconductor memory device 102.

That is, in the nonvolatile semiconductor memory device 102a, each of the plurality of second other memory transistors MC2B includes a channel formed in the second semiconductor layer SEM2, includes a second other control gate CG2B, and allows its data to be electrically rewritten.

As shown in FIG. 8, in the nonvolatile semiconductor memory device 102a thus configured, in the selective erase operation ER in the aforementioned selected cell transistor CL1 of the aforementioned first memory transistors MC1A (memory cells MC belonging to the first memory cell group MCG1), the control unit CTU applies the second voltage (0 V) to the second control gates CG2A (control gate CG2-1 to control gate CG2-4) and the second other control gates CG2B (control gate CG2-5 to control gate CG2-8). The rest is same as the nonvolatile semiconductor memory device 102.

Further, in the write operation WR, the control unit CTU applies the second voltage V2 (0 V) or the fifth voltage V5 (lower voltage Vcc) to the first source line SL1 or sets the first source line in the floating state OPN. The second control gate CG2A and the second other control gate CG2B are subjected to the second voltage V2 (0 V). The rest is same as the nonvolatile semiconductor memory device 102.

Furthermore, in the read operation RD, the control unit CTU applies the second voltage V2 (0 V) to the second control gate CG2A and the second other control gate CG2B. The rest is same as the nonvolatile semiconductor memory device 102.

SECOND PRACTICAL EXAMPLE

In the following, a nonvolatile semiconductor memory device 120 of a second practical example according to the second embodiment is described.

Figure 9:
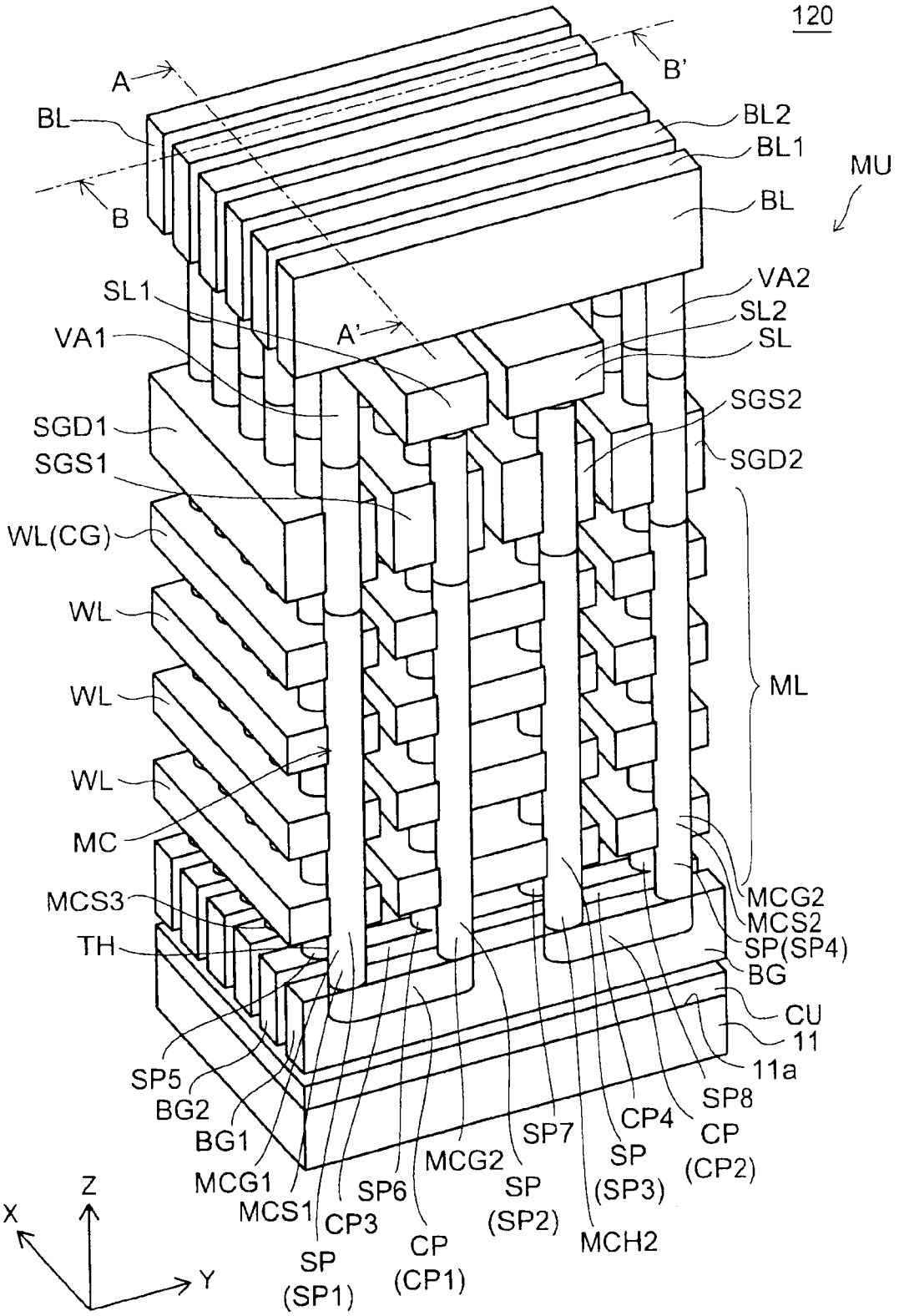
FIG. 9 is a schematic perspective view illustrating the configuration of a nonvolatile semiconductor memory device according to a second practical example.
Figure 10:
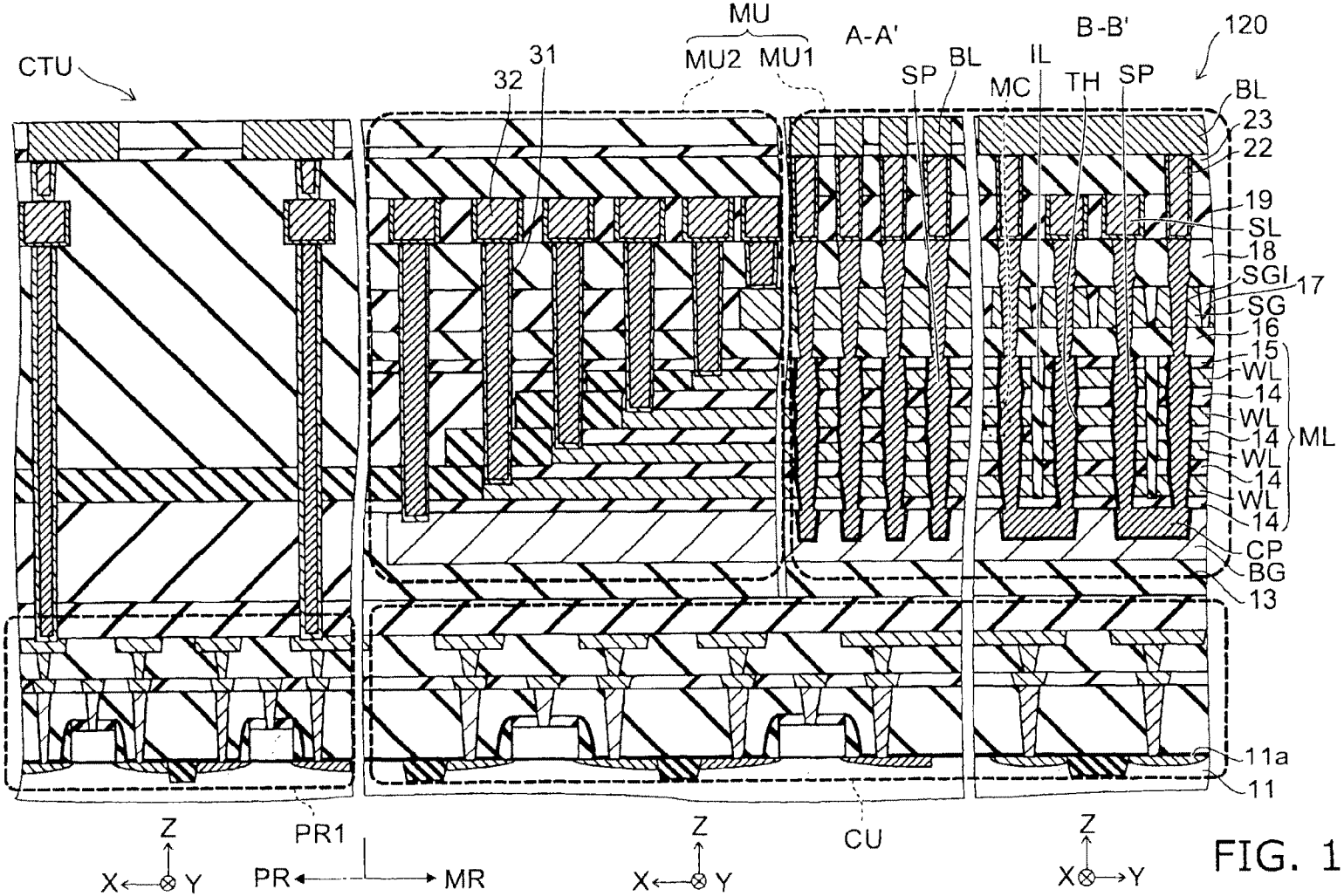
FIG. 10 is a schematic cross-sectional view illustrating the configuration of the nonvolatile semiconductor memory device according to the second practical example.

FIGS. 9 and 10 are a schematic perspective view and a schematic cross-sectional view, respectively, illustrating the configuration of the nonvolatile semiconductor memory device according to the second practical example.

It is noted that for clarity of illustration, FIG. 9 shows only the conductive portions and omits the insulating portions.

As shown in FIGS. 9 and 10, in the nonvolatile semiconductor memory device 120 according to this embodiment, two of the semiconductor pillars SP described with reference to the first practical example are connected by a connecting portion CP.

That is, in addition to the first semiconductor pillar SP1, the memory unit MU further includes a second semiconductor pillar SP2 (semiconductor pillar SP) and a first connecting portion CP1 (connecting portion CP).

The second semiconductor pillar SP2 is adjacent to the first semiconductor pillar SP1 (semiconductor pillar SP) illustratively in the Y-axis direction and pierces the multilayer structure ML in the Z-axis direction. The first connecting portion CP1 electrically connects the first semiconductor pillar SP1 and the second semiconductor pillar SP2 on the same side (substrate 11 side) in the Z-axis direction. The first connecting portion CP1 aligns in the Y-axis direction. The first connecting portion CP1 is made of the same material as the first and second semiconductor pillars SP1 and SP2.

More specifically, a back gate BG (connecting portion conductive layer) is provided on the major surface 11a of the substrate 11 via the interlayer insulating film 13. A trench is provided in portions of the first back gate BG1 (back gate BG) opposed to the first and second semiconductor pillars SP1 and SP2. An outer insulating film 43, a memory layer 48, and an inner insulating film 42 are formed inside the trench, and the remaining space is filled with a connecting portion CP made of a semiconductor. It is noted that the formation of the outer insulating film 43, the memory layer 48, the inner insulating film 42, and the connecting portion CP in the trench is performed simultaneously and collectively with the formation of the outer insulating film 43, the memory layer 48, the inner insulating film 42, and the semiconductor pillar SP in the through hole TH. Thus, the back gate BG is provided opposite to the connecting portion CP.

That is, the first connecting portion CP1 and the first back gate BG1 constitute the first connecting portion transistor CPT1 illustrated in FIG. 5.

Thus, the first and second semiconductor pillars SP1 and SP2 and the connecting portion CP constitute a U-shaped semiconductor pillar, which serves as a U-shaped memory string.

Here, as illustrated in FIG. 10, the electrode film WL between the first and second semiconductor pillars SP1 and SP2 is divided by an insulating layer IL.

As shown in FIGS. 9 and 10, the end of the first semiconductor pillar SP1 opposite to the first connecting portion CP1 is connected to a bit line BL (first bit line BL1), and the end of the second semiconductor pillar SP2 opposite to the first connecting portion CP1 is connected to a source line SL (first source line SL1). Here, the semiconductor pillar SP is connected to the bit line BL by a via VA1 and a via VA2.

In this example, the bit line BL aligns in the Y-axis direction, and the source line SL aligns in the X-axis direction.

Furthermore, between the multilayer structure ML and the bit line BL, a first drain side select gate SGD1 is provided opposite to the first semiconductor pillar SP1, and a first source side select gate SGS1 is provided opposite to the second semiconductor pillar SP2.

Furthermore, a third semiconductor pillar SP3, a fourth semiconductor pillar SP4, and a second connecting portion CP2 (connecting portion CP) are provided.

The third semiconductor pillar SP3 is adjacent to the second semiconductor pillar SP2 on the opposite side of the second semiconductor pillar SP2 from the first semiconductor pillar SP1 in the Y-axis direction and pierces the multilayer structure ML in the Z-axis direction. The fourth semiconductor pillar SP4 is adjacent to the third semiconductor pillar SP3 on the opposite side of the third semiconductor pillar SP3 from the second semiconductor pillar SP2 in the Y-axis direction and pierces the multilayer structure ML in the Z-axis direction.

The second connecting portion CP2 electrically connects the third semiconductor pillar SP3 and the fourth semiconductor pillar SP4 on the same side in the Z-axis direction (on the same side as the first connecting portion CP1). The second connecting portion CP2 aligns in the Y-axis direction and is opposed to the first back gate BG1.

The memory layer 48 is provided also between each of the electrode films WL and the third and fourth semiconductor pillars SP3 and SP4 and between the back gate BG and the second connecting portion CP2. The inner insulating film 42 is provided also between the third and fourth semiconductor pillars SP3 and SP4 and the memory layer 48 and between the memory layer 48 and the second connecting portion CP2. The outer insulating film 43 is provided also between each of the electrode films WL and the memory layer 48 and between the memory layer 48 and the back gate BG.

The source line SL is connected to the third end portion on the opposite side of the third semiconductor pillar SP3 from the second connecting portion CP2. The bit line BL is connected to the fourth end portion on the opposite side of the fourth semiconductor pillar SP4 from the second connecting portion CP2.

Furthermore, a second source side select gate SGS2 is provided opposite to the third semiconductor pillar SP3, and a second drain side select gate SGD2 is provided opposite to the fourth semiconductor pillar SP4.

The select gates SG (first and second drain side select gates SGD1 and SGD2 and first and second source side select gates SGS1 and SGS2) can be made of any conductive material, such as polysilicon or amorphous silicon. In this example, the select gates SG are divided in the Y-axis direction and shaped like strips aligning along the X-axis direction.

Here, with regard to the plurality of semiconductor pillars provided in the nonvolatile semiconductor memory device 120, when all or any of the semiconductor pillars are referred to, the wording "semiconductor pillar SP" is used. On the other hand, when a particular semiconductor pillar is referred to in describing the relationship between the semiconductor pillars, for instance, the wording "n-th semiconductor pillar SPn" (n is any integer of one or more) is used. Likewise, with regard to the connecting portions, the wording "n-th connecting portion CPn" is used.

The first and second semiconductor pillars SP1 and SP2 and the first connecting portion CP1 correspond to the first semiconductor layer SEM1, and the third and fourth semiconductor pillars SP3 and SP4 and the second connecting portion CP2 correspond to the second semiconductor layer SEM2.

Furthermore, fifth to eighth semiconductor pillars SP5 to SP8 and third and fourth connecting portions CP3 and CP4 are provided adjacent in the X-axis direction to the first to fourth semiconductor pillars SP1-SP4 and the first and second connecting portions CP1 and CP2. The fifth and sixth semiconductor pillars SP5 and SP6 and the third connecting portion CP3 correspond to the third semiconductor layer SEM3, and the seventh and eighth semiconductor pillars SP7 and SP8 and the fourth connecting portion CP4 correspond to the fourth semiconductor layer SEM4.

The third and fourth connecting portions CP3 and CP4 align in the Y-axis direction and is opposed to the second back gate BG2, which aligns parallel to the first back gate BG1.

As shown in FIG. 10, an interlayer insulating film 15 is provided at the top (on the side farthest from the substrate 11) of the multilayer structure ML. Furthermore, an interlayer insulating film 16 is provided on the multilayer structure ML, a select gate SG is provided thereon, and an interlayer insulating film 17 is provided between the select gates SG. A through hole TH is provided in the select gate SG, a select gate insulating film SG1 of a select transistor is provided on the inner side surface thereof, and a semiconductor is filled inside it. This semiconductor is included in the semiconductor pillar SP.

Furthermore, an interlayer insulating film 18 is provided on the interlayer insulating film 17. A source line SL and vias 22 (vias VA1 and VA2) are provided thereon, and an interlayer insulating film 19 is provided around the source line SL. Furthermore, an interlayer insulating film 23 is provided on the source line SL, and a bit line BL is provided thereon. The bit line BL is shaped like a strip along the Y axis.

The interlayer insulating films 15, 16, 17, 18, 19, and 23 and the select gate insulating film SG1 can illustratively be made of silicon oxide.

Here, as in the wiring connecting unit MU2 illustrated in FIG. 10, at one end in the X-axis direction, one electrode film WL is connected to a word line 32 by a via plug 31 and electrically connected to, for instance, a driving circuit provided in the substrate 11. Likewise, at the other end in the X-axis direction, another electrode film WL is connected to the word line by the via plug and electrically connected to the driving circuit. That is, the length in the X-axis direction of each of the electrode films WL stacked in the Z-axis direction is varied stepwise, so that electrical connection to the driving circuit is implemented by the one electrode film WL at one end in the X-axis direction and by the other electrode film WL at the other end in the X-axis direction.

In the nonvolatile semiconductor memory device 120 thus configured, the control unit CTU performs the operation illustrated in FIG. 6. Thus, the selective erase operation ER can be performed, and the operational reliability of the device can be improved. Further, it is possible to rewrite data at high speed by selective erasure. Furthermore, the desired operation can be performed by the write operation WR and the read operation RD illustrated in FIG. 6.

Third Embodiment

Figure 11:
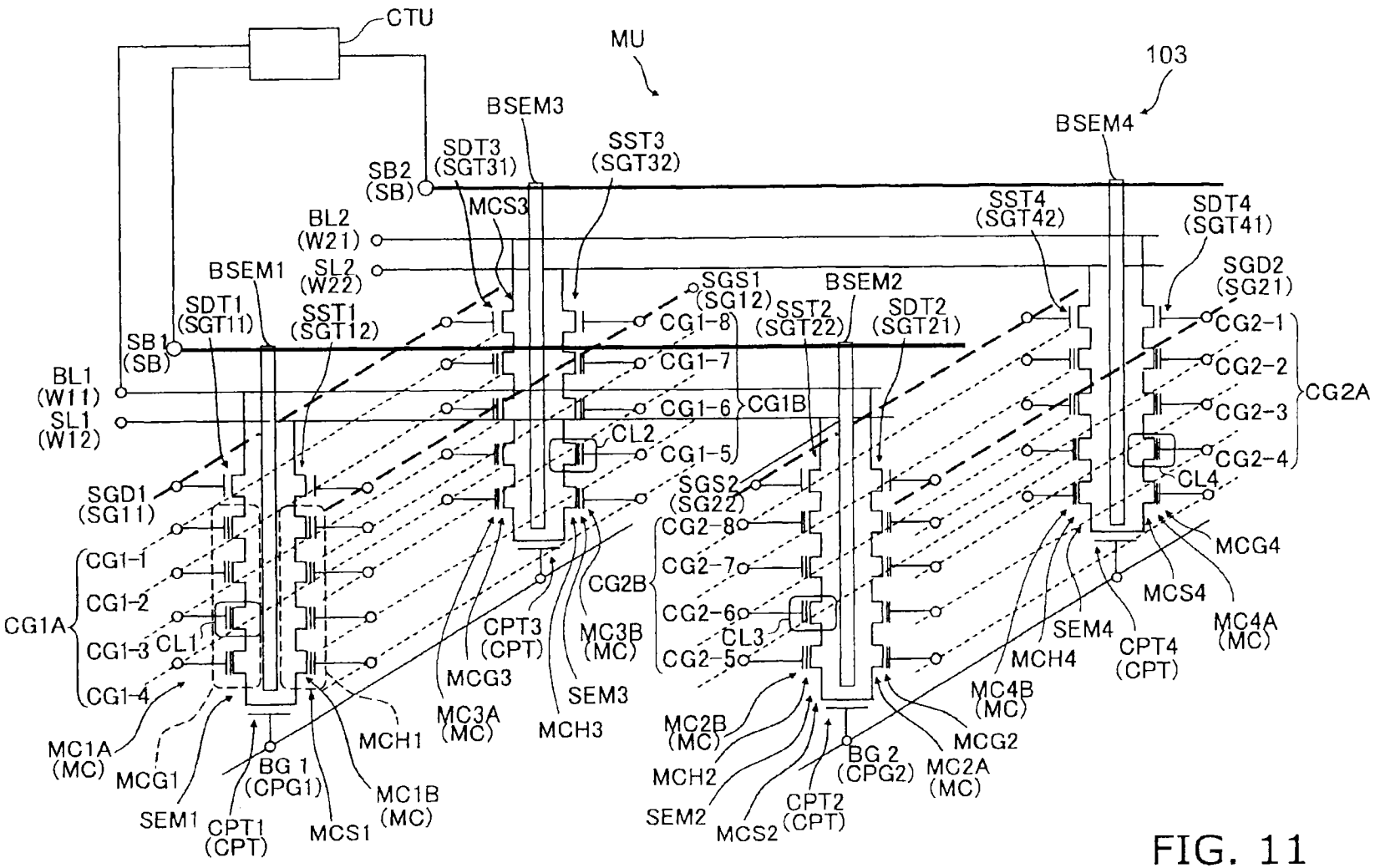
FIG. 11 is a schematic diagram illustrating the configuration of a nonvolatile semiconductor memory device according to a third embodiment.

FIG. 11 is a schematic diagram illustrating the configuration of a nonvolatile semiconductor memory device according to a third embodiment.

More specifically, FIG. 11 is a circuit diagram illustrating the configuration of a nonvolatile semiconductor memory device 103. In FIG. 11, for clarity of illustration, some wirings are not shown.

FIG. 12 is a table illustrating the operation of the nonvolatile semiconductor memory device according to the third embodiment. As shown in FIG. 11, in the nonvolatile semiconductor memory device 103 according to this embodiment, the semiconductor layer of the memory string includes a base semiconductor layer. Each of the memory strings has a folded structure.

More specifically, the nonvolatile semiconductor memory device 103 according to this embodiment includes a memory unit MU and a control unit CTU.

The memory unit MU includes a first memory string MCS1, a first wiring W11, a first other wiring W12, and a first base wiring SB1. In the following description, illustratively, a first bit line BL1 is used as the first wiring W11, and a first source line SL1 is used as the first other wiring W12. The first base wiring SB1 is one of a plurality of base wirings SB provided in the device.

The first memory string MCS1 includes a first memory cell group MCG1, a first other memory cell group MCH1, a first select transistor SGT11, a first other select transistor SGT12, and a first connecting portion transistor CPT1. In the following description, illustratively, a first drain side select transistor SDT1 is used as the first select transistor SGT11, and a first source side select transistor SST1 is used as the first other select transistor SGT12.

The first memory cell group MCG1 includes a plurality of first memory transistors MC1A connected in series. Each of the plurality of first memory transistors MC1A includes a channel formed in a first semiconductor layer SEM1 provided in contact with a first base semiconductor layer BSEM1. Each of the plurality of first memory transistors MC1A includes a first control gate CG1A and allows its data to be electrically rewritten.

The first drain side select transistor SDT1 is provided on one end side of the first memory cell group MCG1, includes a channel formed in the first semiconductor layer SEM1, and includes a first select gate SG11. In the following description, a first drain side select gate SGD1 is illustratively used as the first select gate SG11.

The first source side select transistor SST1 is provided on the opposite side of the first memory cell group MCG1 from the first drain side select transistor SDT1, includes a channel formed in the first semiconductor layer SEM1, and includes a first other select gate SG12. In the following description, a first source side select gate SGS1 is illustratively used as the first other select gate SG12.

The first connecting portion transistor CPT1 is provided between the first memory cell group MCG1 and the first source side select transistor SST1, includes a channel formed in the first semiconductor layer SEM1, and includes a first connecting portion gate CPG1. In the following description, a first back gate BG1 is illustratively used as the first connecting portion gate CPG1.

The first other memory cell group MCH1 is provided between the first source side select transistor SST1 and the first connecting portion transistor CPT1 and includes a plurality of first other memory transistors MC1B connected in series.

Each of the plurality of first other memory transistors MC1B includes a channel formed in the first semiconductor layer SEM1, includes a first other control gate CG1B, and allows its data to be electrically rewritten.

The first bit line BL1 is connected to the first semiconductor layer SEM1 on the opposite side of the first drain side select transistor SDT1 from the first memory cell group MCG1.

The first source line SL1 is connected to the first semiconductor layer SEM1 on the opposite side of the first source side select transistor SST1 from the first other memory cell group MCH1.

The first base wiring SB1 is connected to the first base semiconductor layer BSEM1.

In the nonvolatile semiconductor memory device 103, the bit line and the source line are arranged parallel to each other and cross (e.g., orthogonally) the select gate, the control gate, and the back gate.

(Selective Erase Operation ER)

In the following, a description is given of the operation of the control unit CTU in the selective erase operation ER in this nonvolatile semiconductor memory device 103.

In the selective erase operation ER in a selected cell transistor CL1 of the first memory transistors MC1A (memory cells MC belonging to the first memory cell group MCG1), the control unit CTU performs the following operation. Here, this selected cell transistor CL1 includes the control gate CG1-3.

As shown in FIG. 12, the control unit CTU applies a first voltage V1 (e.g., high voltage Vpp, such as 20 V) to the first bit line BL1 and the first source line SL1. Alternatively, the control unit CTU sets the first bit line BL1 and the first source line SL1 in the floating state OPN.

Furthermore, the selected cell gate CG1-3 of the selected cell transistor CL1 is subjected to a second voltage V2 (e.g., 0 V) lower than the first voltage V1.

The non-selected cell gates (control gate CG1-1, control gate CG1-2, and control gate CG1-4) of the first memory transistors MC1A other than the selected cell transistor CL1 are subjected to a third voltage V3 (e.g., medium voltage Vm, such as 10 V) lower than the first voltage V1 and higher than the second voltage V2.

The first other control gates CG1B (control gate CG1-5 to control gate CG1-8) are subjected to the third voltage V3 (e.g., medium voltage Vm).

The first drain side select gate SGD1 and the first source side select gate SGS1 are subjected to a tenth voltage V10 lower than the first voltage V1 and higher than the second voltage V2. The medium voltage Vm (e.g., 10 V) is illustratively used as the tenth voltage V10.

The first back gate BG1 is subjected to an eleventh voltage V11 lower than the first voltage V1 and higher than the second voltage V2. The medium voltage Vm can be used as the eleventh voltage V11.

The first base wiring SB1 is subjected to the first voltage V1 (e.g., high voltage Vpp, such as 20 V).

Under this voltage relationship, a high electric field is applied between the charge retention layer of the selected cell transistor CL1 and the first base semiconductor layer BSEM1, which results in at least one of release of electrons from the charge retention layer toward the first base semiconductor layer BSEM1 and injection of holes into the charge retention layer. Thus, the threshold voltage of the selected cell transistor CL1 falls below 0 V.

In the non-selected memory cells belonging to the same memory cell group as the selected cell transistor CL1, the control gates are subjected to the medium voltage Vm (e.g., 10 V), and hence the applied electric field is low. Thus, the non-selected memory cells are not erased.

In addition, as shown in FIG. 11, the memory unit MU can further include a second memory string MCS2.

The second memory string MCS2 includes a second memory cell group MCG2, a second other memory cell group MCH2, a second select transistor SGT21, a second other select transistor SGT22, and a second connecting portion transistor CPT2. In the following description, illustratively, a second drain side select transistor SDT2 is used as the second select transistor SGT21, and a second source side select transistor SST2 is used as the second other select transistor SGT22.

The second memory cell group MCG2 includes a plurality of second memory transistors MC2A connected in series. Each of the plurality of second memory transistors MC2A includes a channel formed in a second semiconductor layer SEM2 provided in contact with a second base semiconductor layer BSEM2 and electrically isolated from the first semiconductor layer SEM1, includes a second control gate CG2A, and allows its data to be electrically rewritten.

The second drain side select transistor SDT2 is provided on one end side of the second memory cell group MCG2, includes a channel formed in the second semiconductor layer SEM2, and includes a second select gate SG21. In the following description, a second drain side select gate SGD2 is illustratively used as the second select gate SG21.

The second source side select transistor SST2 is provided on the opposite side of the second memory cell group MCG2 from the second drain side select transistor SDT2, includes a channel formed in the second semiconductor layer SEM2, and includes a second other select gate SG22. In the following description, a second source side select gate SGS2 is illustratively used as the second other select gate SG22.

The second connecting portion transistor CPT2 is provided between the second memory cell group MCG2 and the second source side select transistor SST2, includes a channel formed in the second semiconductor layer SEM2, and includes a second connecting portion gate CPG2. In the following description, a second back gate BG2 is illustratively used as the second connecting portion gate CPG2.

The second other memory cell group MCH2 is provided between the second source side select transistor SST2 and the second connecting portion transistor CPT2 and includes a plurality of second other memory transistors MC2B connected in series.

Each of the plurality of second other memory transistors MC2B includes a channel formed in the second semiconductor layer SEM2, includes a second other control gate CG2B, and allows its data to be electrically rewritten.

In the selective erase operation ER in the aforementioned selected cell transistor CL1 of the aforementioned first memory transistors MC1A (memory cells MC belonging to the first memory cell group MCG1), as shown in FIG. 12, the control unit CTU applies the third voltage V3 (medium voltage Vm) to the second control gates CG2A (control gate CG2-1 to control gate CG2-4) and the second other control gates CG2B (control gate CG2-5 to control gate CG2-8).

The second drain side select gate SGD2 and the second source side select gate SGS2 are subjected to the tenth voltage V10.

The second back gate BG2 is subjected to the eleventh voltage V11.

Here, as described above, the first base wiring SB1 is subjected to the first voltage V1 (e.g., high voltage Vpp, or 20 V).

Erroneous erasure is suppressed in the memory cells MC belonging to the second memory string MCS2 commonly connected to the first base wiring SB1, the first bit line BL1, and the first source line SL1 because the second drain side select gate SGD2, the second source side select gate SGS2, the second control gate CG2A and second other control gates CG2B (control gate CG2-1 to control gate CG2-8), and the second back gate BG2 are subjected to the medium voltage Vm (10 V).

Thus, the non-selected memory cells of the second memory transistors MC2A and the second other memory transistors MC2B belonging to the second memory string MCS2 are not erased.

In addition, as shown in FIG. 11, the memory unit MU can further include a third memory string MCS3, a second wiring W21, a second other wiring W22, and a second base wiring SB2. In the following description, illustratively, a second bit line BL2 is used as the second wiring W21, and a second source line SL2 is used as the second other wiring W22. The second base wiring SB2 is one of the plurality of base wirings SB provided in the device.

The third memory string MCS3 includes a third memory cell group MCG3, a third other memory cell group MCH3, a third select transistor SGT31, a third other select transistor SGT32, and a third connecting portion transistor CPT3. In the following description, illustratively, a third drain side select transistor SDT3 is used as the third select transistor SGT31, and a third source side select transistor SST3 is used as the third other select transistor SGT32.

The third memory cell group MCG3 includes a plurality of third memory transistors MC3A connected in series. Each of the plurality of third memory transistors MC3A includes a channel formed in a third semiconductor layer SEM3 provided in contact with a third base semiconductor layer BSEM3 and electrically isolated from the first semiconductor layer SEM1 and the second semiconductor layer SEM2, is connected to the first control gate CG1A, and allows its data to be electrically rewritten.

The third drain side select transistor SDT3 is provided on one end side of the third memory cell group MCG3, includes a channel formed in the third semiconductor layer SEM3, and is connected to the first select gate SG11.

The third source side select transistor SST3 is provided on the opposite side of the third memory cell group MCG3 from the third drain side select transistor SDT3, includes a channel formed in the third semiconductor layer SEM3, and is connected to the first other select gate SG12.

The third connecting portion transistor CPT3 is provided between the third memory cell group MCG3 and the third source side select transistor SST3, includes a channel formed in the third semiconductor layer SEM3, and is connected to the first connecting portion gate CPG1.

The third other memory cell group MCH3 is provided between the third source side select transistor SST3 and the third connecting portion transistor CPT3 and includes a plurality of third other memory transistors MC3B connected in series.

Each of the plurality of third other memory transistors MC3B includes a channel formed in the third semiconductor layer SEM3, is connected to the first other control gate CG1B, and allows its data to be electrically rewritten.

The second bit line BL2 is connected to the third semiconductor layer SEM3 on the opposite side of the third drain side select transistor SDT3 from the third memory cell group MCG3.

The second source line SL2 is connected to the third semiconductor layer SEM3 on the opposite side of the third source side select transistor SST3 from the third other memory cell group MCH3.

The second base wiring SB2 is connected to the third base semiconductor layer BSEM3.

In the selective erase operation ER in the aforementioned selected cell transistor CL1 of the aforementioned first memory transistors MC1A (memory cells MC belonging to the first memory cell group MCG1), as shown in FIG. 12, the control unit CTU further applies a twelfth voltage V12 lower than the first voltage V1 and higher than the second voltage V2 to the second bit line BL2 and the second source line SL2. Alternatively, the control unit CTU sets the second bit line BL2 and the second source line SL2 in the floating state OPN. The medium voltage Vm (e.g., 10 V) can illustratively be used as the twelfth voltage V12.

The second base wiring SB2 is subjected to a thirteenth voltage V13 lower than the first voltage V1 and higher than the second voltage V2. The medium voltage Vm (e.g., 10 V) can illustratively be used as the thirteenth voltage V13. Alternatively, the second base wiring SB2 may be set in the floating state OPN.

Thus, in the memory cells MC belonging to the memory string (third memory string MCS3) commonly connected to the control gate CG, select gate SG, and back gate BG of the memory cell group to which the selected cell transistor CL1 belongs, the second bit line BL2 and the second source line SL2 are subjected to the medium voltage Vm (10 V) or set in the floating state OPN, and hence no electric field is applied thereto. Thus, these memory cells MC are not erased.

In addition, as shown in FIG. 11, the memory unit MU can further include a fourth memory string MCS4.

The fourth memory string MCS4 includes a fourth memory cell group MCG4, a fourth other memory cell group MCH4, a fourth select transistor SGT41, a fourth other select transistor SGT42, and a fourth connecting portion transistor CPT4. In the following description, illustratively, a fourth drain side select transistor SDT4 is used as the fourth select transistor SGT41, and a fourth source side select transistor SST4 is used as the fourth other select transistor SGT42.

The fourth memory cell group MCG4 includes a plurality of fourth memory transistors MC4A connected in series. Each of the plurality of fourth memory transistors MC4A includes a channel formed in a fourth semiconductor layer SEM4 provided in contact with a fourth base semiconductor layer BSEM4 and electrically isolated from the first semiconductor layer SEM1, the second semiconductor layer SEM2, and the third semiconductor layer SEM3, is connected to the second control gate CG2A, and allows its data to be electrically rewritten.

The fourth drain side select transistor SDT4 is provided on one end side of the fourth memory cell group MCG4, includes a channel formed in the fourth semiconductor layer SEM4, and is connected to the second select gate SG21.

The fourth source side select transistor SST4 is provided on the opposite side of the fourth memory cell group MCG4 from the fourth drain side select transistor SDT4, includes a channel formed in the fourth semiconductor layer SEM4, and is connected to the second other select gate SG22.

The fourth connecting portion transistor CPT4 is provided between the fourth memory cell group MCG4 and the fourth source side select transistor SST4, includes a channel formed in the fourth semiconductor layer SEM4, and is connected to the second connecting portion gate CPG2.

The fourth other memory cell group MCH4 is provided between the fourth source side select transistor SST4 and the fourth connecting portion transistor CPT4 and includes a plurality of fourth other memory transistors MC4B connected in series.

Each of the plurality of fourth other memory transistors MC4B includes a channel formed in the fourth semiconductor layer SEM4, is connected to the second other control gate CG2B, and allows its data to be electrically rewritten.

The second bit line BL2 is further connected to the fourth semiconductor layer SEM4 on the opposite side of the fourth drain side select transistor SDT4 from the fourth memory cell group MCG4.

The second source line SL2 is further connected to the fourth semiconductor layer SEM4 on the opposite side of the fourth source side select transistor SST4 from the fourth other memory cell group MCH4.

The second base wiring SB2 is further connected to the fourth base semiconductor layer BSEM4.

Also in each memory cell MC of the fourth memory string MCS4 thus configured, like the second memory string MCS2 and the third memory string MCS3, no erasure occurs.

(Write Operation)

In the following, a description is given of the operation of the control unit CTU in the write operation WR in this nonvolatile semiconductor memory device 103.

In the write operation WR in the selected cell transistor CL1 of the first memory transistors MC1A, the control unit CTU performs the following operation.

The control unit CTU applies the second voltage V2 (0 V) to the first bit line BL1. Furthermore, the selected cell gate (control gate CG1-3) of the selected cell transistor CL1 is subjected to the first voltage V1 (high voltage Vpp).

The non-selected cell gates (control gate CG1-1, control gate CG1-2, and control gate CG1-4) of the first memory transistors MC1A other than the selected cell transistor CL1 are subjected to the fifth voltage V5 (low voltage Vcc).

The first drain side select gate SGD1 is subjected to the fifth voltage V5 (low voltage Vcc).

The second bit line BL2 is subjected to the fifth voltage V5 (low voltage Vcc). Alternatively, the second bit line BL2 is set in the floating state OPN.

The first base wiring SB1 is subjected to the second voltage V2 (0 V).

Furthermore, the control unit CTU applies the second voltage V2 (0 V) or the fifth voltage V5 (low voltage Vcc) to the first source line SL1 or sets the first source line SL1 in the floating state OPN.

The first other control gates CG1B (control gate CG1-5 to control gate CG1-8) are subjected to the fifth voltage V5 (low voltage Vcc).

The first source side select gate SGS1 is subjected to the second voltage V2 (0 V).

The first back gate BG1 is subjected to the fifth voltage V5 (low voltage Vcc).

The second source line SL2 is subjected to the second voltage V2 (0 V) or the fifth voltage V5 (low voltage Vcc), or the second source line SL2 is set in the floating state OPN.

The second control gates CG2A (control gate CG2-1 to control gate CG2-4) and the second other control gates CG2B (control gate CG2-5 to control gate CG2-8) are subjected to the second voltage V2 (0 V) or the low voltage Vcc. The second drain side select gate SGD2 and the second back gate BG2 are subjected to the second voltage V2 (0 V) or the low voltage Vcc, or the second drain side select gate SGD2 and the second back gate BG2 are set in the floating state OPN. Here, the second control gate CG2A and the second other control gate CG2B, and the second drain side select gate SGD2 and the second back gate BG2 may be subjected to 0 V also in the case where the second voltage V2 is not 0 V.

The second source side select gate SGS2 is subjected to the second voltage V2 (0 V) or the fifth voltage (low voltage Vcc), or the second source side select gate SGS2 is set in the floating state OPN.

Furthermore, the second base wiring SB2 is subjected to the low voltage Vcc. Alternatively, the second base wiring SB2 is set in the floating state OPN. Here, in the case where the second voltage V2 is not 0 V, the second base wiring SB2 may be subjected to 0 V.

Thus, the desired select transistor (in this case, the selected cell transistor CL1 belonging to the first memory transistors MC1A) can be written.

More specifically, a high electric field is applied between the charge retention layer of the selected cell transistor CL1 and the first base semiconductor layer BSEM1. Hence, electrons are injected into the charge retention layer, or holes are released into the first base semiconductor layer BSEM1. Thus, the threshold voltage of the selected cell transistor CL1 exceeds 0V.

In the non-selected memory cells belonging to the same memory cell group as the selected cell transistor CL1, the applied electric field is low, and hence no writing occurs.

On the other hand, writing is prevented in the memory cells MC included in the memory string adjacent to the memory string commonly connected to the first control gate CG1A and the first other control gates CG1B (control gate CG1-1 to control gate CG1-8), the first drain side select gate SGD1, the first source side select gate SGS1, and the first back gate BG1 and including the selected cell transistor CL because the second bit line BL2 is subjected to the low voltage Vcc (e.g., 3 V) or set in the floating state OPN and the second source line SL2 is subjected to the second voltage V2 (0 V) or the fifth voltage (low voltage Vcc), or the second source side select gate SGS2 is set in the floating state OPN.

Furthermore, erroneous writing is prevented in the memory string commonly connected to the first base wiring SB1, the first bit line BL1, and the first source line SL1 because the second drain side select gate SGD2 and the second source side select gate SGS2, the second control gate CG2A and the second other control gates CG2B (control gate CG2-1 to control gate CG2-8), and the second back gate BG2 are subjected to the low voltage Vcc (e.g., 3 V) or 0 V.

(Read Operation RD)

Furthermore, a description is given of the operation of the control unit CTU in the read operation RD in this nonvolatile semiconductor memory device 103.

In the read operation RD in the selected cell transistor CL1 of the first memory transistors MC1A, the control unit CTU performs the following operation.

The control unit CTU applies a reading bit line voltage Ve not higher than the fifth voltage V5 (e.g., low voltage Vcc) and higher than the second voltage V2 (e.g., 0 V) to the first bit line BL1. The reading bit line voltage Ve can illustratively be 1 V to 2 V.

The selected cell gate (control gate CG1-3) of the selected cell transistor CL1 is subjected to the sense voltage Vse.

The non-selected cell gates (control gate CG1-1, control gate CG1-2, and control gate CG1-4) of the first memory transistors MC1A other than the selected cell transistor CL1 are subjected to the fifth voltage V5 (low voltage Vcc).

The first drain side select gate SGD1 is subjected to the fifth voltage V5 (low voltage Vcc).

The second bit line BL2 is subjected to the second voltage V2 (0 V).

The first base wiring SB1 is subjected to the second voltage V2 (0 V).

Furthermore, the control unit CTU applies the second voltage V2 (0 V) to the first source line SL1.

The first other control gates CG1B (control gate CG1-5 to control gate CG1-8) are subjected to the fifth voltage V5 (low voltage Vcc).

The first source side select gate SGS1 is subjected to the fifth voltage V5 (low voltage Vcc).

The first back gate BG1 is subjected to the fifth voltage V5 (low voltage Vcc).

The second source line SL2 is subjected to the second voltage V2 (0 V).

The second control gates CG2A (control gate CG2-1 to control gate CG2-4) and the second other control gates CG2B (control gate CG2-5 to control gate CG2-8) are subjected to the second voltage V2 (0 V).

The second drain side select gate SGD2 is subjected to the second voltage V2 (0 V).

The second source side select gate SGS2 is subjected to the second voltage V2 (0 V).

The second back gate BG2 is subjected to the second voltage V2 (0 V).

The second base wiring SB2 is subjected to the second voltage V2 (0 V).

Thus, the data stored in the desired select transistor (in this case, the selected cell transistor CL1 belonging to the first memory transistors MC1A) can be read.

Furthermore, as shown in FIG. 11, also in the case where the selected memory cells are the selected cell transistors CL2, CL3, and CL4 belonging, respectively, to the second, third, and fourth memory string, MCS2, MCS3, and MCS4, the voltages under the condition illustrated in FIG. 12 can be used to perform the selective erase operation ER.

Furthermore, the write operation WR and the read operation RD can be performed likewise.

In the nonvolatile semiconductor memory device 103 according to this embodiment, the base semiconductor layer is not isolated for each memory cell group, but is shared by the adjacent memory cell groups like each bit line BL and each source line SL. In the structure in which the base semiconductor layer is isolated for each memory cell group, selective erasure can be performed by applying the second voltage V2 (0 V) to the select gate SG, control gate CG, and back gate BG of the memory cell groups sharing the bit line BL and the source line SL. This has the advantage of reducing the number of terminals to be energized.

Figure 13:
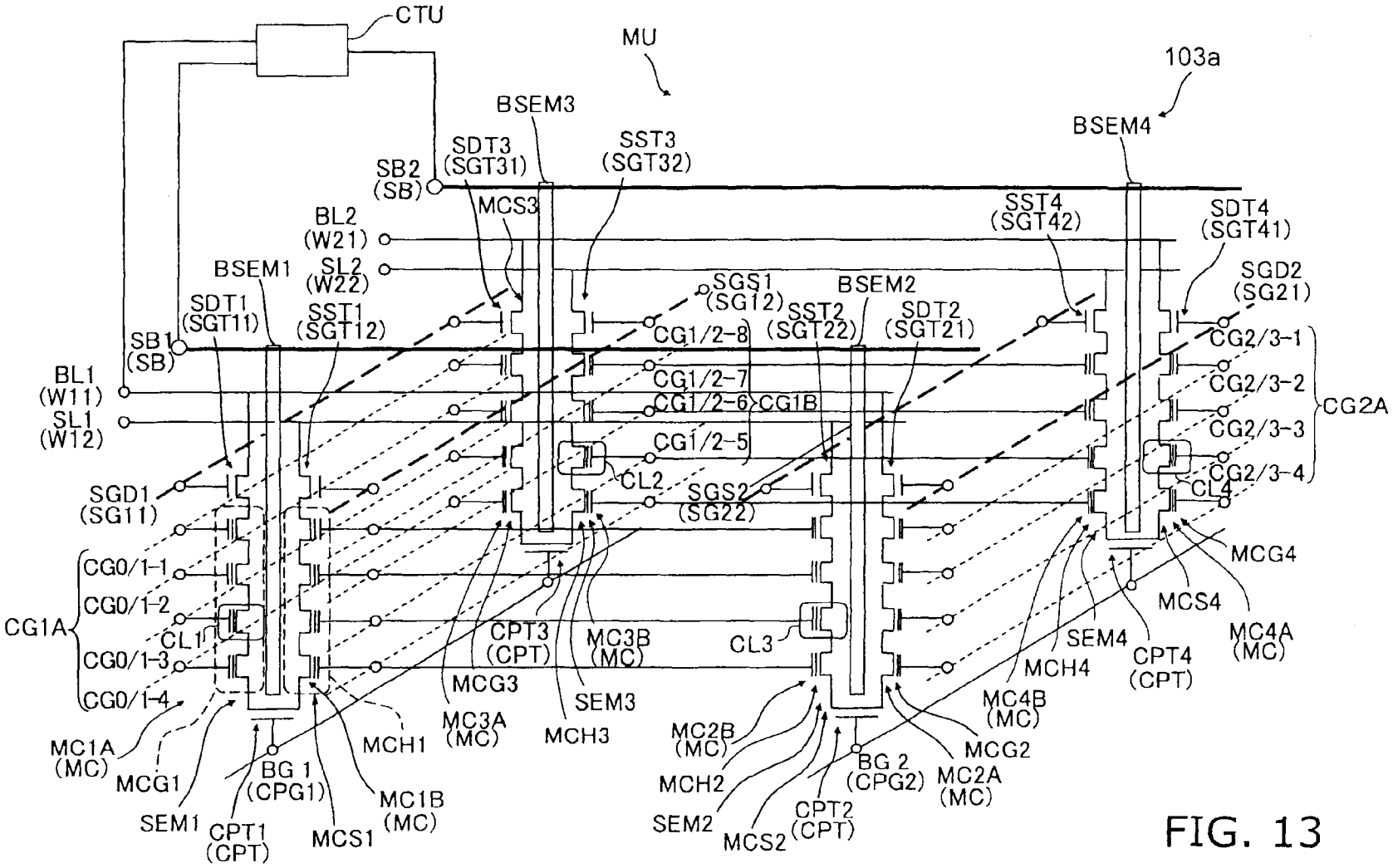
FIG. 13 is a schematic diagram illustrating the configuration of an alternative nonvolatile semiconductor memory device according to the third embodiment.

FIG. 13 is a schematic diagram illustrating the configuration of an alternative nonvolatile semiconductor memory device according to the third embodiment.

More specifically, FIG. 13 is a circuit diagram illustrating the configuration of a nonvolatile semiconductor memory device 103a. In FIG. 13, for clarity of illustration, some wirings are not shown.

FIG. 14 is a table illustrating the operation of the alternative nonvolatile semiconductor memory device according to the third embodiment.

As shown in FIG. 13, in the nonvolatile semiconductor memory device 103a, the first other control gate CG1B of the first other memory transistor MC1B is electrically connected to the control gate of the second other memory transistor MC2B. The rest is same as the nonvolatile semiconductor memory device 103.

That is, in the nonvolatile semiconductor memory device 103a, each of the plurality of second other memory transistors MC2B includes a channel formed in the second semiconductor layer SEM2, includes the control gate (second other control gate) electrically connected to the first other control gate CG1B, and allows its data to be electrically rewritten.

As shown in FIG. 14, in the nonvolatile semiconductor memory device 103a thus configured, in the selective erase operation ER, the write operation WR, and the read operation RD, the control unit CTU implements the same operations as the nonvolatile semiconductor memory device 103.

THIRD PRACTICAL EXAMPLE

In the following, a nonvolatile semiconductor memory device 130 of a third practical example according to the third embodiment is described.

Figure 15:
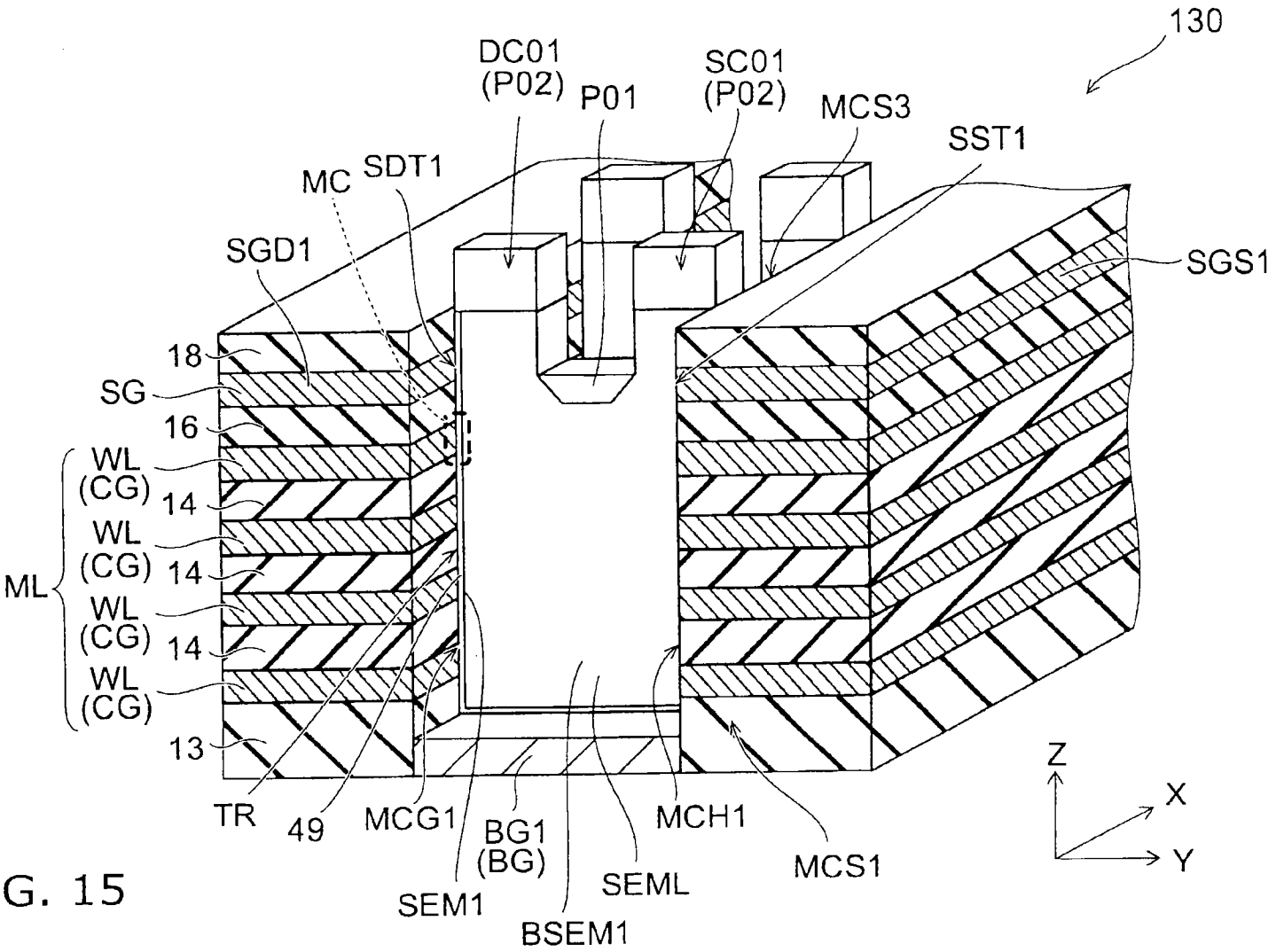
FIG. 15 is a schematic perspective view illustrating the configuration of a nonvolatile semiconductor memory device according to a third practical example.

FIG. 15 is a schematic perspective view illustrating the configuration of the nonvolatile semiconductor memory device according to the third practical example.

More specifically, FIG. 15 illustrates the configuration of the first and third memory strings MCS1 and MCS3.

As shown in FIG. 15, in the nonvolatile semiconductor memory device 130, an interlayer insulating film 13 is provided on a substrate, not shown, and a multilayer structure ML with electrode films WL and interelectrode insulating films 14 alternately stacked therein is provided on the interlayer insulating film 13. Furthermore, a select gate SG is provided thereon, and an interlayer insulating film 18 is provided thereon.

Furthermore, a trench TR is formed in the interlayer insulating film 18, the select gate SG, and the multilayer structure ML. A back gate (first back gate BG1) is provided at the bottom of the trench TR. A stacked insulating film 49 of an outer insulating film 43, a memory layer 48, and an inner insulating film 42 is provided on the inner wall of the trench and on the back gate BG. The remaining space inside it is filled with a semiconductor layer SEML illustratively made of p-type polysilicon. The portion of this semiconductor layer SEML near the electrode film WL serves as a first semiconductor layer SEM1. Furthermore, the central portion of the semiconductor layer SEML away from the electrode film WL serves as a base semiconductor layer (first base semiconductor layer BSEM1). A $p^+$-region P01, for instance, having a higher impurity concentration than the first base semiconductor layer BSEM1 is provided in an upper portion of the first base semiconductor layer BSEM1 and serves as a contact portion of the first base wiring SB1 in the first base semiconductor layer BSEM1.

A first drain side select transistor SDT1 is provided on one wall surface side of the trench TR, and a first source side select transistor SST1 is provided on the other wall surface side of the trench TR. That is, the select gate SG on one wall surface side of the trench TR serves as a first drain side select gate SGD1, and the select gate SG on the other wall surface side of the trench TR serves as a first source side select gate SGS1. Here, the stacking direction of the multilayer structure ML is the Z-axis direction, and the direction in which the wall surfaces of the trench TR are opposed to each other is the Y-axis direction. Also in this case, the direction perpendicular to the Z-axis direction and the Y-axis direction is the X-axis direction.

An $n^+$-region P02 illustratively having a higher impurity concentration than the first base semiconductor layer BSEM1 is provided in an upper portion of the first semiconductor layer SEM1. The $n^+$-region P02 on one wall surface side of the trench TR constitutes a drain side contact DC01, and the $n^+$-region P02 on the other wall surface side of the trench TR constitutes a source side contact SC01.

A third memory string MCS3 having the same configuration as the first memory string MCS1 is provided adjacent to the first memory string MCS1 in the X-axis direction.

In the nonvolatile semiconductor memory device 130 thus configured, the control unit CTU performs the operation illustrated in FIG. 12. Thus, the selective erase operation ER can be performed, and the operational reliability of the device can be improved. Further, it is possible to rewrite data at high speed by selective erasure. Furthermore, the desired operation can be performed by the write operation WR and the read operation RD illustrated in FIG. 12.

The nonvolatile semiconductor memory devices 101 to 103, 110, 120, and 130 according to the above first to third embodiments and the first to third practical examples enable selective erasure. This improves reliability because no stress due to unnecessary data rewrite is applied to the memory cell. Furthermore, the data rewrite speed is increased because data rewrite is needed only in the memory cell requiring data rewrite in the high-capacity memory cell array.

In the nonvolatile semiconductor memory devices according to the embodiments and practical examples of the invention, the interelectrode insulating film 14, the inner insulating film 42, and the outer insulating film 43 can be a monolayer film made of a material selected from a group including silicon oxide, silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, or a multilayer film made of a plurality of materials selected from the group.

The memory layer 48 can be a monolayer film made of a material selected from a group including silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, or a multilayer film made of a plurality of materials selected from the group.

In the specification of the application, "perpendicular"and "parallel" refer to not only strictly perpendicular and strictly parallel but also include, for instance, the fluctuation due to manufacturing processes, etc. It is sufficient to be substantially perpendicular and substantially parallel.

The embodiments of the invention have been described with reference to examples. However, the invention is not limited to these examples. For instance, various specific configurations of the components, such as the memory unit, control unit, semiconductor substrate, electrode film, insulating film, insulating layer, multilayer structure, memory layer, charge storage layer, semiconductor pillar, semiconductor layer, base semiconductor layer, word line, bit line, source line, wiring, memory transistor, and select transistor constituting the nonvolatile semiconductor memory device are encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible, and such combinations are also encompassed within the scope of the invention as long as they fall within the spirit of the invention.

Furthermore, those skilled in the art can suitably modify and implement the nonvolatile semiconductor memory device described above in the embodiments of the invention, and all the nonvolatile semiconductor memory devices thus modified are also encompassed within the scope of the invention as long as they fall within the spirit of the invention.

Furthermore, those skilled in the art can conceive various modifications and variations within the spirit of the invention, and it is understood that such modifications and variations are also encompassed within the scope of the invention. For instance, those skilled in the art can suitably modify the above embodiments by addition, deletion, or design change of components, or by addition, omission, or condition change of processes, and such modifications are also encompassed within the scope of the invention as long as they fall within the spirit of the invention.

The invention claimed is:

[1. A nonvolatile semiconductor memory device comprising:

a memory unit; and a control unit, the memory unit including a first memory string, a first wiring, a second memory string, and a second wiring, the first memory string including a first memory cell group and a first select transistor, the first memory cell group including a plurality of first memory transistors connected in series, each of the plurality of first memory transistors including a channel formed in a first semiconductor layer, including a first control gate, and allowing data of the each of the plurality of first memory transistors to be electrically rewritten, the first select transistor being provided on one end side of the first memory cell group, including a channel formed in the first semiconductor layer, and including a first select gate, the first wiring being connected to the first semiconductor layer on a side of the first select transistor opposite to the first memory cell group, the second memory string including a second memory cell group and a second select transistor, the second memory cell group including a plurality of second memory transistors connected in series, each of the plurality of second memory transistors including a channel formed in a second semiconductor layer electrically isolated from the first semiconductor layer, including a control gate electrically connected to the first control gate, and allowing data of the each of the plurality of second memory transistors to be electrically rewritten, the second select transistor being provided on one end side of the second memory cell group, including a channel formed in the second semiconductor layer, and including a select gate connected to the first select gate, the second wiring being connected to the second semiconductor layer on a side of the second select transistor opposite to the second memory cell group, in a selective erase operation for performing at least one of injection of a hole into a charge retention layer of a selected cell transistor in the selective erase operation of the first memory transistors and extraction of an electron from the charge retention layer of the selected cell transistor in the selective erase operation, the control unit being configured to:

apply a first voltage to the first wiring, apply a second voltage lower than the first voltage to a selected cell gate of the first control gate of the selected cell transistor in the selective erase operation, apply a third voltage not higher than the first voltage and higher than the second voltage to a non-selected cell gate in the selective erase operation of the first control gate of the first memory transistors other than the selected cell transistor in the selective erase operation, apply the first voltage or a fourth voltage not higher than the first voltage and not lower than the third voltage to the first select gate, and apply the second voltage or a fifth voltage higher than the second voltage and not higher than the third voltage to the second wiring or set the second wiring in a floating state.]

[2. The device according to claim 1, wherein the second voltage is 0 volts, and the third voltage is substantially equal to the fourth voltage.]

[3. The device according to claim 1, further comprising:

a substrate, the first semiconductor layer and the second semiconductor layer aligning in a direction perpendicular to a major surface of the substrate.]

[4. The device according to claim 1, wherein in a selective write operation for performing at least one of injection of an electron into a charge retention layer of a selected cell transistor in the selective write operation of the first memory transistors and extraction of a hole from the charge retention layer of the selected cell transistor in the selective write operation, the control unit is configured to:

apply the first voltage to a selected cell gate of the first control gate of the selected cell transistor in the selective write operation, apply the second voltage to the first wiring, apply a voltage higher than the second voltage and not higher than the third voltage to a non-selected cell gate in the selective write operation of the first control gate of the first memory transistors other than the selected cell transistor in the selective write operation, apply a voltage higher than the second voltage and not higher than the third voltage to the first select gate, and apply a voltage higher than the second voltage and not higher than the third voltage to the second wiring.]

[5. The device according to claim 1, wherein in a read operation for reading data written in a selected cell transistor in the read operation of the first memory transistors, the control unit is configured to:

apply a reading bit line voltage not higher than the fifth voltage and higher than the second voltage to the first wiring, apply a sense voltage varied between the fifth voltage and the second voltage to a selected cell gate of the first control gate of the selected cell transistor in the read operation, apply the fifth voltage to a non-selected cell gate in the read operation of the first control gate of the first memory transistors other than the selected cell transistor in the read operation, apply the fifth voltage to the first select gate, and apply the second voltage to the second wiring.]

[6. The device according to claim 1, wherein the memory unit further includes a third memory string, the third memory string includes a third memory cell group and a third select transistor, the third memory cell group includes a plurality of third memory transistors connected in series, each of the plurality of third memory transistors includes a channel formed in a third semiconductor layer electrically isolated from the first semiconductor layer and the second semiconductor layer, includes a second control gate, and allows data of the each of the plurality of third memory transistors to be electrically rewritten, the third select transistor is provided on one end side of the third memory cell group, includes a channel formed in the third semiconductor layer, and includes a second select gate, the first wiring is connected to the third semiconductor layer on a side of the third select transistor opposite to the third memory cell group, and in the selective erase operation, the control unit is configured to:

apply a sixth voltage lower than the third voltage to the second control gate of the third memory transistors, and apply a seventh voltage lower than the third voltage to the second select gate.]

[7. The device according to claim 6, wherein the sixth voltage and the seventh voltage are 0 volts.]

[8. The device according to claim 6, wherein in a selective write operation for performing at least one of injection of an electron into a charge retention layer of a selected cell transistor in the selective write operation of the first memory transistors and extraction of a hole from the charge retention layer of the selected cell transistor in the selective write operation, the control unit is configured to:

apply a voltage lower than the third voltage to the second control gate of the third memory transistors, and apply a voltage lower than the third voltage to the second select gate.]

[9. The device according to claim 6, wherein in a read operation for reading data written in a selected cell transistor in the read operation of the first memory transistors, the control unit is configured to:

apply the second voltage to the second control gate of the third memory transistors, and apply the second voltage to the second select gate.]

[10. The device according to claim 1, wherein the memory unit further includes a first other wiring and a second other wiring, the first memory string further includes a first other memory cell group, a first other select transistor, and a first connecting portion transistor, the first other select transistor is provided on a side of the first memory cell group opposite to the first select transistor, includes a channel formed in the first semiconductor layer, and includes a first other select gate, the first connecting portion transistor is provided between the first memory cell group and the first other select transistor, includes a channel formed in the first semiconductor layer, and includes a first connecting portion gate, the first other memory cell group is provided between the first other select transistor and the first connecting portion transistor and includes a plurality of first other memory transistors connected in series, each of the plurality of first other memory transistors includes a channel formed in the first semiconductor layer, includes a first other control gate, and allows data of the each of the plurality of first other memory transistors to be electrically rewritten, the first other wiring is connected to the first semiconductor layer on a side of the first other select transistor opposite to the first other memory cell group, the second memory string further includes a second other memory cell group, a second other select transistor, and a second connecting portion transistor, the second other select transistor is provided on a side of the second memory cell group opposite to the second select transistor, includes a channel formed in the second semiconductor layer, and includes a second other select gate, the second connecting portion transistor is provided between the second memory cell group and the second other select transistor, includes a channel formed in the second semiconductor layer, and includes a connecting portion gate electrically connected to the first connecting portion gate, the second other memory cell group is provided between the second other select transistor and the second connecting portion transistor and includes a plurality of second other memory transistors connected in series, each of the plurality of second other memory transistors includes a channel formed in the second semiconductor layer, includes a second other control gate electrically connected to the first other control gate, and allows data of the each of the plurality of second other memory transistors to be electrically rewritten, the second other wiring is connected to the second semiconductor layer on a side of the second other select transistor opposite to the second other memory cell group, and in the selective erase operation, the control unit is further configured to:

apply the fifth voltage or the second voltage to the first other wiring or set the first other wiring in a floating state, apply the third voltage to the first other control gate, apply an eighth voltage lower than the third voltage to the first other select gate, apply a ninth voltage lower than the first voltage and higher than the second voltage to the first connecting portion gate, apply the fifth voltage, the first voltage, or the second voltage to the second other wiring or set the second other wiring in a floating state, apply the sixth voltage or the third voltage to the second control gate, apply the eighth voltage to the second select gate, and apply the eighth voltage to the second other select gate.]

[11. The device according to claim 10, wherein the eighth voltage is substantially equal to the second voltage, and the ninth voltage is substantially equal to the third voltage.]

[12. The device according to claim 10, further comprising:

a substrate, the first semiconductor layer and the second semiconductor layer aligning in a direction perpendicular to a major surface of the substrate.]

[13. The device according to claim 10, wherein in a selective write operation for performing at least one of injection of an electron into a charge retention layer of a selected cell transistor in the selective write operation of the first memory transistors and extraction of a hole from the charge retention layer of the selected cell transistor in the selective write operation, the control unit is configured to:

apply the second voltage to the first wiring, apply the first voltage to a selected cell gate of the first control gate of the selected cell transistor in the selective write operation, apply the fifth voltage to a non-selected cell gate in the selective write operation of the first control gate of the first memory transistors other than the selected cell transistor in the selective write operation, apply the fifth voltage to the first select gate, the second wiring, the first other control gate, and the first connecting portion gate, apply the fifth voltage or the second voltage to the first other wiring or set the first other wiring in a floating state, apply the second voltage to the first other select gate, the second other wiring, the second select gate, the second other select gate, and the second connecting portion gate, and apply the second voltage or the fifth voltage to the second control gate.]

[14. The device according to claim 10, wherein in a read operation for reading data written in a selected cell transistor in the read operation of the first memory transistors, the control unit is configured to:

apply a reading bit line voltage not higher than the fifth voltage and higher than the second voltage to the first wiring, apply a sense voltage varied between the fifth voltage and the second voltage to a selected cell gate of the first control gate of the selected cell transistor in the read operation, apply the fifth voltage to a non-selected cell gate in the read operation of the first control gate of the first memory transistors other than the selected cell transistor in the read operation, apply the fifth voltage to the first select gate, the first other control gate, the first other select gate, and the first connecting portion gate, and apply the second voltage to the second wiring, the first other wiring, the second other wiring, the second control gate, the second select gate, the second other select gate, and the second connecting portion gate.]

[15. A nonvolatile semiconductor memory device comprising:

a memory unit; and a control unit, the memory unit including a first memory string, a first wiring, a first other wiring, and a first base wiring, the first memory string including a first memory cell group, a first other memory cell group, a first select transistor, a first other select transistor, and a first connecting portion transistor, the first memory cell group including a plurality of first memory transistors connected in series, each of the plurality of first memory transistors including a channel formed in a first semiconductor layer provided in contact with a first base semiconductor layer, including a first control gate, and allowing data of the each of the plurality of first memory transistors to be electrically rewritten, the first select transistor being provided on one end side of the first memory cell group, including a channel formed in the first semiconductor layer, and including a first select gate, the first other select transistor being provided on a side of the first memory cell group opposite to the first select transistor, including a channel formed in the first semiconductor layer, and including a first other select gate, the first connecting portion transistor being provided between the first memory cell group and the first other select transistor, including a channel formed in the first semiconductor layer, and including a first connecting portion gate, the first other memory cell group being provided between the first other select transistor and the first connecting portion transistor and including a plurality of first other memory transistors connected in series, each of the plurality of first other memory transistors including a channel formed in the first semiconductor layer, including a first other control gate, and allowing data of the each of the plurality of first other memory transistors to be electrically rewritten, the first wiring being connected to the first semiconductor layer on a side of the first select transistor opposite to the first memory cell group, the first other wiring being connected to the first semiconductor layer on a side of the first other select transistor opposite to the first other memory cell group, the first base wiring being connected to the first base semiconductor layer, in a selective erase operation for performing at least one of injection of a hole into a charge retention layer of a selected cell transistor in the selective erase operation of the first memory transistors and extraction of an electron from the charge retention layer of the selected cell transistor in the selective erase operation, the control unit being configured to:

apply a first voltage to the first wiring and the first other wiring or set the first wiring and the first other wiring in a floating state, apply a second voltage lower than the first voltage to a selected cell gate of the first control gate of the selected cell transistor in the selective erase operation, apply a third voltage lower than the first voltage and higher than the second voltage to a non-selected cell gate in the selective erase operation of the first control gate of the first memory transistors other than the selected cell transistor in the selective erase operation, apply the third voltage to the first other control gate, apply a tenth voltage lower than the first voltage and higher than the second voltage to the first select gate and the first other select gate, apply an eleventh voltage lower than the first voltage and higher than the second voltage to the first connecting portion gate, and apply the first voltage to the first base wiring.]

[16. The device according to claim 15, wherein the second voltage is 0 volts, and the tenth voltage and the eleventh voltage are substantially equal to the third voltage.]

[17. The device according to claim 15, wherein the memory unit further includes a second memory string, the second memory string includes a second memory cell group, a second other memory cell group, a second select transistor, a second other select transistor, and a second connecting portion transistor, the second memory cell group includes a plurality of second memory transistors connected in series, each of the plurality of second memory transistors includes a channel formed in a second semiconductor layer provided in contact with a second base semiconductor layer and electrically isolated from the first semiconductor layer, includes a second control gate, and allows data of the each of the plurality of second memory transistors to be electrically rewritten, the second select transistor is provided on one end side of the second memory cell group, includes a channel formed in the second semiconductor layer, and includes a second select gate, the second other select transistor is provided on a side of the second memory cell group opposite to the second select transistor, includes a channel formed in the second semiconductor layer, and includes a second other select gate, the second connecting portion transistor is provided between the second memory cell group and the second other select transistor, includes a channel formed in the second semiconductor layer, and includes a second connecting portion gate, the second other memory cell group is provided between the second other select transistor and the second connecting portion transistor and includes a plurality of second other memory transistors connected in series, each of the plurality of second other memory transistors includes a channel formed in the second semiconductor layer, includes a second other control gate, and allows data of the each of the plurality of second other memory transistors to be electrically rewritten, the first wiring is further connected to the second semiconductor layer on a side of the second select transistor opposite to the second memory cell group, the first other wiring is further connected to the second semiconductor layer on a side of the second other select transistor opposite to the second other memory cell group, the first base wiring is further connected to the second base semiconductor layer, and in the selective erase operation, the control unit is further configured to:

apply the third voltage to the second control gate and the second other control gate, apply the tenth voltage to the second select gate and the second other select gate, and apply the eleventh voltage to the second connecting portion gate.]

[18. The device according to claim 17, wherein the memory unit further includes a third memory string, a second wiring, a second other wiring, and a second base wiring, the third memory string includes a third memory cell group, a third other memory cell group, a third select transistor, a third other select transistor, and a third connecting portion transistor, the third memory cell group includes a plurality of third memory transistors connected in series, each of the plurality of third memory transistors includes a channel formed in a third semiconductor layer provided in contact with a third base semiconductor layer and electrically isolated from the first semiconductor layer and the second semiconductor layer, is connected to the first control gate, and allows data of the each of the plurality of third memory transistors to be electrically rewritten, the third select transistor is provided on one end side of the third memory cell group, includes a channel formed in the third semiconductor layer, and is connected to the first select gate, the third other select transistor is provided on a side of the third memory cell group opposite to the third select transistor, includes a channel formed in the third semiconductor layer, and is connected to the first other select gate, the third connecting portion transistor is provided between the third memory cell group and the third other select transistor, includes a channel formed in the third semiconductor layer, and is connected to the first connecting portion gate, the third other memory cell group is provided between the third other select transistor and the third connecting portion transistor and includes a plurality of third other memory transistors connected in series, each of the plurality of third other memory transistors includes a channel formed in the third semiconductor layer, is connected to the first other control gate, and allows data of each of the plurality of third other memory transistors to be electrically rewritten, the second wiring is connected to the third semiconductor layer on a side of the third select transistor opposite to the third memory cell group, the second other wiring is connected to the third semiconductor layer on a side of the third other select transistor opposite to the third other memory cell group, the second base wiring is connected to the third base semiconductor layer, and in the selective erase operation, the control unit is further configured to:

apply a twelfth voltage lower than the first voltage and higher than the second voltage to the second wiring and the second other wiring or set the second wiring and the second other wiring in the floating state, and apply a thirteenth voltage lower than the first voltage and higher than the second voltage to the second base wiring or set the second base wiring in the floating state.]

[19. The device according to claim 18, wherein in a selective write operation for performing at least one of injection of an electron into a charge retention layer of a selected cell transistor in the selective write operation of the first memory transistors and extraction of a hole from the charge retention layer of the selected cell transistor in the selective write operation, the control unit is configured to:

apply the second voltage to the first wiring, the first other select gate, and the first base wiring, apply a fifth voltage higher than the second voltage and not higher than the third voltage to the first select gate and the first connecting portion gate, apply the first voltage to a selected cell gate of the first control gate of the selected cell transistor in the selective write operation, apply the fifth voltage to a non-selected cell gate in the selective write operation of the first control gate of the first memory transistors other than the selected cell transistor in the selective write operation, apply the second voltage or the fifth voltage to the first other wiring, the second other wiring, the second select gate, the second other select gate, the second base wiring, and the second connecting portion gate or set the first other wiring, the second other wiring, the second select gate, the second other select gate, the second base wiring, and the second connecting portion gate in the floating state, apply the fifth voltage to the second wiring or set the second wiring in the floating state, and apply the second voltage or the fifth voltage to the second control gate and the second other control gate.]

[20. The device according to claim 18, wherein in a read operation for reading data written in a selected cell transistor of the first memory transistors, the control unit is configured to:

apply a reading bit line voltage not higher than a fifth voltage and higher than the second voltage to the first wiring, the fifth voltage being higher than the second voltage and not higher than the third voltage, apply a sense voltage varied between the fifth voltage and the second voltage to a selected cell gate of the first control gate of the selected cell transistor in the read operation, apply the fifth voltage to a non-selected cell gate in the read operation of the first control gate of the first memory transistors other than the selected cell transistor in the read operation, apply the fifth voltage to the first select gate, the first other control gate, the first other select gate, and the first connecting portion gate, and apply the second voltage to the second wiring, the first base wiring, the first other wiring, the second other wiring, the second control gate, the second other control gate, the second select gate, the second other select gate, the second connecting portion gate, and the second base wiring.]

[21. A nonvolatile semiconductor memory device comprising:

a memory unit; and a control unit, the memory unit including a first memory string, a first wiring, a second memory string, a second wiring, a third memory string, a first other wiring, and a second other wiring, the first memory string including a first memory cell group, a first select transistor, a first other memory cell group, a first other select transistor, and a first connecting portion transistor, the first memory cell group including a plurality of first memory transistors connected in series, each of the plurality of first memory transistors including a channel formed in a first semiconductor layer, including a first control gate, and allowing data to be electrically rewritten, the first select transistor being provided on one end side of the first memory cell group, including a channel formed in the first semiconductor layer, and including a first select gate, the first other select transistor being provided on a side of the first memory cell group opposite to the first select transistor, including a channel formed in the first semiconductor layer, and including a first other select gate, the first connecting portion transistor being provided between the first memory cell group and the first other select transistor, including a channel formed in the first semiconductor layer, and including a first connecting portion gate, the first other memory cell group being provided between the first other select transistor and the first connecting portion transistor, and including a plurality of first other memory transistors connected in series, each of the plurality of first other memory transistors including a channel formed in the first semiconductor layer, including a first other control gate, and allowing data to be electrically rewritten, the second memory string including a second memory cell group, a second select transistor, a second other memory cell group, a second other select transistor, and a second connecting portion transistor, the second memory cell group including a plurality of second memory transistors connected in series, each of the plurality of second memory transistors including a channel formed in a second semiconductor layer electrically isolated from the first semiconductor layer, including a second control gate, and allowing data to be electrically rewritten, the second select transistor being provided on one end side of the second memory cell group, including a channel formed in the second semiconductor layer, and including a second select gate, the second other select transistor being provided on a side of the second memory cell group opposite to the second select transistor, including a channel formed in the second semiconductor layer, and including a second other select gate, the second connecting portion transistor being provided between the second memory cell group and the second other select transistor, including a channel formed in the second semiconductor layer, and including a connecting portion gate electrically connected to the first connecting portion gate, the second other memory cell group being provided between the second other select transistor and the second connecting portion transistor, and including a plurality of second other memory transistors connected in series, each of the plurality of second other memory transistors including a channel formed in the second semiconductor layer, including a control gate electrically connected to the first other control gate, and allowing data to be electrically rewritten, the third memory string including a third memory cell group, a third select transistor, a third other memory cell group, a third other select transistor, and a third connecting portion transistor, the third memory cell group including a plurality of third memory transistors connected in series, each of the plurality of third memory transistors including a channel formed in a third semiconductor layer electrically isolated from the first semiconductor layer and the second semiconductor layer, including a control gate electrically connected to the first control gate, and allowing data to be electrically rewritten, the third select transistor being provided on one end side of the third memory cell group, including a channel formed in the third semiconductor layer, and including a select gate connected to the first select gate, the third other select transistor being provided on a side of the third memory cell group opposite to the third select transistor, including a channel formed in the third semiconductor layer, and including a select gate connected to the first other select gate, the third connecting portion transistor being provided between the third memory cell group and the third other select transistor, including a channel formed in the third semiconductor layer, and including a second connecting portion gate, the third other memory cell group being provided between the third other select transistor and the third connecting portion transistor and including a plurality of third other memory transistors connected in series, each of the plurality of third other memory transistors including a channel formed in the third semiconductor layer, being electrically connected to the first other control gate, and allowing data to be electrically rewritten, the first wiring being connected to the first semiconductor layer on a side of the first select transistor opposite to the first memory cell group, and being connected to the second semiconductor layer on a side of the second select transistor opposite to the second memory cell group, the second wiring being connected to the third semiconductor layer on a side of the third select transistor opposite to the third memory cell group, the first other wiring being connected to the first semiconductor layer on a side of the first other select transistor opposite to the first other memory cell group, and being connected to the third semiconductor layer on a side of the third other select transistor opposite to the third other memory cell group, the second other wiring being connected to the second semiconductor layer on a side of the second other select transistor opposite to the second other memory cell group, in a selective erase operation for performing at least one of injection of a hole into a charge retention layer of a selected cell transistor of the first memory transistors and extraction of an electron from the charge retention layer, the control unit being configured to:

apply a first voltage to the first wiring, apply a second voltage lower than the first voltage to a selected cell gate of the selected cell transistor, apply a third voltage not higher than the first voltage and higher than the second voltage to a non-selected cell gate of the first memory transistors other than the selected cell transistor, apply a fourth voltage not higher than the first voltage and not lower than the third voltage to the first select gate, apply the second voltage or a fifth voltage higher than the second voltage and not higher than the third voltage to the second wiring, apply a sixth voltage lower than the third voltage to the second control gate of the second memory transistors, apply a seventh voltage lower than the third voltage to the second select gate, apply the fifth voltage or the second voltage to the first other wiring, apply the third voltage to the first other control gate, apply an eighth voltage lower than the third voltage to the first other select gate, apply a ninth voltage lower than the first voltage and higher than the second voltage to the first connecting portion gate, apply the second voltage to the second other wiring, apply the sixth voltage to the second control gate, apply the eighth voltage to the second select gate, and apply the eighth voltage to the second other select gate.]

*22. A nonvolatile semiconductor memory device comprising:*

*a memory array including a first memory string, the first memory string including a first memory cell and a second memory cell, the first memory cell being provided at a first position of a first semiconductor layer, the second memory cell being provided at a second position of the first semiconductor layer, the first semiconductor layer extending in a first direction, an end of the first semiconductor layer being connected with an end of a second semiconductor layer extending in the first direction;*

*a first wiring extending in a second direction crossing the first direction, the first wiring being connected with the first memory cell;*

*a second wiring extending in the second direction, the second wiring being connected with the second memory cell;*

*a first bit line electrically connected with the first semiconductor layer;*

*a first source line electrically connected with the first semiconductor layer; and*

*a control circuit configured to perform a selective erase operation to selectively erase the first memory cell without erasing the second memory cell by:*

*applying a first voltage to the first bit line,*

*applying a second voltage to the first wiring, the second voltage being lower than the first voltage,*

*applying a third voltage to the second wiring, the third voltage being higher than the second voltage, and*

*applying a fourth voltage to the first source line, the fourth voltage being higher than the second voltage.*

*23. The device according to claim 22, wherein*

*the third voltage is lower than the first voltage.*

*24. The device according to claim 22, wherein*

*the fourth voltage is equal to the first voltage.*

*25. The device according to claim 22, further comprising:*

*a third wiring extending in the second direction,*

*the first memory string further including a first transistor provided at the first semiconductor layer, the first transistor being connected with one end of the first memory cell, and*

*the third wiring being connected with the first transistor.*

*26. The device according, to claim 25, wherein to perform the selective erase operation, the control circuit applies a fifth voltage to the third wiring, the fifth voltage being lower than the first voltage.*

*27. The device according to claim 26, wherein*

*the fifth voltage is higher than the second voltage.*

*28. The device according to claim 26, wherein*

*the fifth voltage is equal to the third voltage.*

*29. The device according to claim 25, further comprising*

*a fourth wiring extending in the second direction,*

*the first memory string further including a second transistor provided at the first semiconductor layer, the second transistor being connected with one end of the first memory cell, and*

*the fourth wiring being connected with the second transistor.*

*30. The device according to claim 29, wherein to perform the selective erase operation, the control circuit applies a sixth voltage to the fourth wiring, the sixth voltage being lower than the first voltage.*

*31. The device according to claim 30, wherein*

*the sixth voltage is higher than the second voltage.*

*32. The device according to claim 30, wherein*

*the sixth voltage is equal to the third voltage.*

*33. The device according to claim 30, wherein*

*the memory array further includes a third memory string,*

*the third memory string includes a fifth memory cell and a sixth memory cell, the fifth memory cell is provided at a fifth position of a third semiconductor layer, the sixth memory cell is provided at a sixth position of the third semiconductor layer, the third semiconductor layer extends in the first direction, and*

*the first bit line is further electrically connected with the third semiconductor layer, and*

*the first source line is further electrically connected with the third semiconductor layer.*

*34. The device according to claim 33, further comprising*

*a fifth wiring connected with the fifth memory cell; and*

*a sixth wiring connected with the sixth memory cell.*

*35. The device according to claim 34, wherein to perform the selective erase operation, the control circuit*

*applies a ninth voltage to the fifth wiring, the ninth voltage being lower than the first voltage, and*

*applies a tenth voltage to the sixth wiring, the tenth voltage being lower than the first voltage.*

*36. The device according to claim 35, wherein*

*the ninth voltage is equal to the tenth voltage.*

*37. The device according to claim 22, wherein*

*the memory array further includes a second memory string,*

*the second memory string includes a third memory cell and a fourth memory cell, the third memory cell is provided at a third position of the second semiconductor layer, and the fourth memory cell is provided at a fourth position of the second semiconductor layer,*

*the first wiring is further connected with the third memory cell, and*

*the second wiring is further connected with the fourth memory cell.*

*38. The device according to claim 37, further comprising:*

*a second bit line electrically connected with the second memory string, wherein*

*to perform the selective erase operation, the control circuit applies a seventh voltage to the second bit line, the seventh voltage being higher than the second voltage and lower than the first voltage.*

*39. The device according to claim 38, further comprising:*

*a second source line electrically connected with the second semiconductor layer, wherein*

*to perform the selective erase operation, the control circuit applies an eighth voltage to the second source line, the eighth voltage being higher than the second voltage and lower than the first voltage.*

*40. The device according to claim 39, wherein*

*the seventh voltage is equal to the eighth voltage.*

*41. A nonvolatile semiconductor memory device comprising:*

*a memory array including a first memory string, the first memory string including a first memory cell and a second memory cell, the first memory cell being provided at a first position of a first semiconductor layer, the second memory cell being provided at a second position of the first semiconductor layer, and the first semiconductor layer extending in a first direction;*

*a first wiring extending in a second direction crossing the first direction, the first wiring being connected with the first memory cell;*

*a second wiring extending in the second direction, the second wiring being connected with the second menu cell;*

*a first bit line electrically connected with the first semiconductor layer;*

*a first source line electrically connected with the first semiconductor layer; and*

*a control circuit configured to perform a selective erase operation to selectively erase the first memory cell without erasing the second memory cell by:*

*applying a first voltage to the first bit line,*

*applying a second voltage to the first wiring, the second voltage being lower than the first voltage,*

*applying a third voltage to the second wiring, third voltage being higher than the second voltage, and*

*applying a fourth voltage to the first source line in the erase operation, the fourth voltage being higher than the second voltage.*

* * * * *